US012750959B2

(12) United States Patent
Song

(10) Patent No.: US 12,750,959 B2
(45) Date of Patent: Sep. 29, 2026

(54) ELECTRONIC DEVICE COMPRISING A LATTICE PLATE AND A PLURALITY OF SUPPORT BARS CONNECTED TO EACH OTHER BY WELDING

(71) Applicant: Samsung Electronics Co., Ltd., Suwon-si (KR)

(72) Inventor: Hyundo Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/778,207

(22) Filed: Jul. 19, 2024

(65) Prior Publication Data

US 2025/0056740 A1 Feb. 13, 2025

Related U.S. Application Data

(63) Continuation of application No. PCT/KR2024/007698, filed on Jun. 5, 2024.

(30) Foreign Application Priority Data

Aug. 7, 2023 (KR) ........................ 10-2023-0102863
Sep. 8, 2023 (KR) ........................ 10-2023-0119745

(51) Int. Cl.
*H05K 5/02* (2006.01)

(52) U.S. Cl.
CPC .................................. *H05K 5/0217* (2013.01)

(58) Field of Classification Search
CPC .......................... H05K 5/0217; H04M 1/0235; H04M 1/0237; H04M 1/0268; G09F 9/301
See application file for complete search history.

(56) References Cited

U.S. PATENT DOCUMENTS 10,963,014 B1 * 3/2021 Park ...................... G06F 1/1652
2019/0018458 A1 1/2019 Turchin et al.
(Continued)

FOREIGN PATENT DOCUMENTS

CN 115731803 A 3/2023
KR 10-2010-0135547 A 12/2010
(Continued)

OTHER PUBLICATIONS

International Search Report and Written Opinion dated Sep. 6, 2024, issued in International Application No. PCT/KR2024/007698.
(Continued)

*Primary Examiner* — Allen L Parker
*Assistant Examiner* — Peter Krim
(74) *Attorney, Agent, or Firm* — Jefferson IP Law, LLP

(57) ABSTRACT

An electronic device is provided. The electronic device includes a first housing that includes a first cover, a sliding plate fixed to the first cover, and a body frame configured to slidably support the sliding plate, a second housing surrounding at least a portion of the first cover and connected to the body frame and configured to slidably support the first housing, wherein the first housing and the second housing are configured to switch a state between an extended state and a reduced state, a display that is connected to the sliding plate and transformable, wherein the display comprises a flat portion that maintains a flat shape and a rolling portion of which a shape is transformed, and the rolling portion comprises an exposed area that is visually exposed to an outside and a non-exposed area that is not visually exposed to the outside when the first housing and the second housing are in the extended state, a lattice plate connected to the display, wherein a plurality of holes is formed through the lattice plate, a plurality of first support bars connected to an exposed area of the display, a plurality of second support (Continued)

bars connected to a non-exposed area of the display, a first welded part configured to connect the plurality of first support bars to the lattice plate, and an adhesive layer configured to connect the plurality of second support bars to the lattice plate.

20 Claims, 19 Drawing Sheets

(56) References Cited

U.S. PATENT DOCUMENTS

| | | | | |
|---|---|---|---|---|
| 2022/0117100 | A1* | 4/2022 | Yoon | G06F 1/1652 |
| 2022/0201880 | A1* | 6/2022 | Choi | H05K 5/0217 |
| 2023/0217613 | A1 | 7/2023 | Cho et al. | |
| 2024/0015237 | A1* | 1/2024 | Mun | G06F 1/16 |

FOREIGN PATENT DOCUMENTS

| | | | |
|---|---|---|---|
| KR | 10-2020-0117741 | A | 10/2020 |
| KR | 10-2021-0148396 | A | 12/2021 |
| KR | 10-2022-0008732 | A | 1/2022 |
| KR | 10-2022-0061789 | A | 5/2022 |
| KR | 10-2022-0061798 | A | 5/2022 |
| KR | 10-2023-0009936 | A | 1/2023 |
| KR | 10- 2023-0103822 | A | 7/2023 |
| KR | 10-2023-0110142 | A | 7/2023 |

OTHER PUBLICATIONS

Extended European Search Report dated Jun. 25, 2026, issued in a European Patent Application No. 24852022.

* cited by examiner

ELECTRONIC DEVICE COMPRISING A LATTICE PLATE AND A PLURALITY OF SUPPORT BARS CONNECTED TO EACH OTHER BY WELDING

CROSS-REFERENCE TO RELATED APPLICATION(S)

This application is a continuation application, claiming priority under § 365(c), of an International application No. PCT/KR2024/007698, filed on Jun. 5, 2024, which is based on and claims the benefit of a Korean patent application number 10-2023-0102863, filed on Aug. 7, 2023, in the Korean Intellectual Property Office, and of a Korean patent application number 10-2023-0119745, filed on Sep. 8, 2023, in the Korean Intellectual Property Office, the disclosure of each of which is incorporated by reference herein in its entirety.

TECHNICAL FIELD

The disclosure relates to an electronic device. More particularly, the disclosure relates to an electronic device including a lattice plate and a support bar connected to each other by welding.

BACKGROUND ART

Electronic devices including flexible displays have been developed. For example, one housing may move relative to another housing such that a screen display area of a display may be extended or reduced.

The above information is presented as background information only to assist with an understanding of the disclosure. No determination has been made, and no assertion is made, as to whether any of the above might be applicable as prior art with regard to the disclosure.

DISCLOSURE OF THE INVENTION

Aspects of the disclosure are to address at least the above-mentioned problems and/or disadvantages and to provide at least the advantages described below. Accordingly, an aspect of the disclosure is to provide electronic device including a lattice plate and a support bar connected to each other by welding.

Additional aspects will be set forth in part in the description which follows and, in part, will be apparent from the description, or may be learned by practice of the presented embodiments.

In accordance with an aspect of the disclosure, an electronic device is provided. The electronic device includes a first housing including a first cover, a sliding plate fixed to the first cover, and a body frame configured to slidably support the sliding plate, a second housing surrounding at least a portion of the first cover and connected to the body frame and configured to slidably support the first housing, wherein the first housing and the second housing are configured to switch a state between an extended state and a reduced state, a display that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate connected to the display, wherein a plurality of holes is formed through the lattice plate, a plurality of first support bars connected to the exposed area of the display, a plurality of second support bars connected to the non-exposed area of the display, a first welded part configured to connect the plurality of first support bars to the lattice plate, and an adhesive layer configured to connect the plurality of second support bars to the lattice plate.

In accordance with another aspect of the disclosure, an electronic device is provided. The electronic device includes a first housing including a first cover, a sliding plate fixed to the first cover, and a body frame configured to slidably support the sliding plate, a second housing surrounding at least a portion of the first cover and connected to the body frame and configured to slidably support the first housing, wherein the first housing and the second housing are configured to switch a state between an extended state and a reduced state, a display that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate connected to the display, wherein a plurality of holes is formed through the lattice plate, a plurality of support bars connected to the display, and a welded part configured to connect the plurality of support bars to the lattice plate.

In accordance with another aspect of the disclosure, an electronic device is provided. The electronic device includes a first housing including a first cover, a sliding plate fixed to the first cover, and a body frame configured to slidably support the sliding plate, a second housing surrounding at least a portion of the first cover and connected to the body frame and configured to slidably support the first housing, wherein the first housing and the second housing are configured to switch a state between an extended state and a reduced state, a display that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate connected to the display, wherein a plurality of holes is formed through the lattice plate, a plurality of first support bars connected to the exposed area of the display, a plurality of second support bars connected to the non-exposed area of the display, a first welded part configured to connect the plurality of first support bars to the lattice plate, a second welded part configured to connect the plurality of second support bars to the lattice plate, and an adhesive layer configured to connect the plurality of second support bars to the lattice plate, wherein the second welded part is provided as a pair of second welded parts, and the pair of second welded parts is opposite to each other based on the adhesive layer.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an integrated circuit (IC), or the like.

Figure 1:
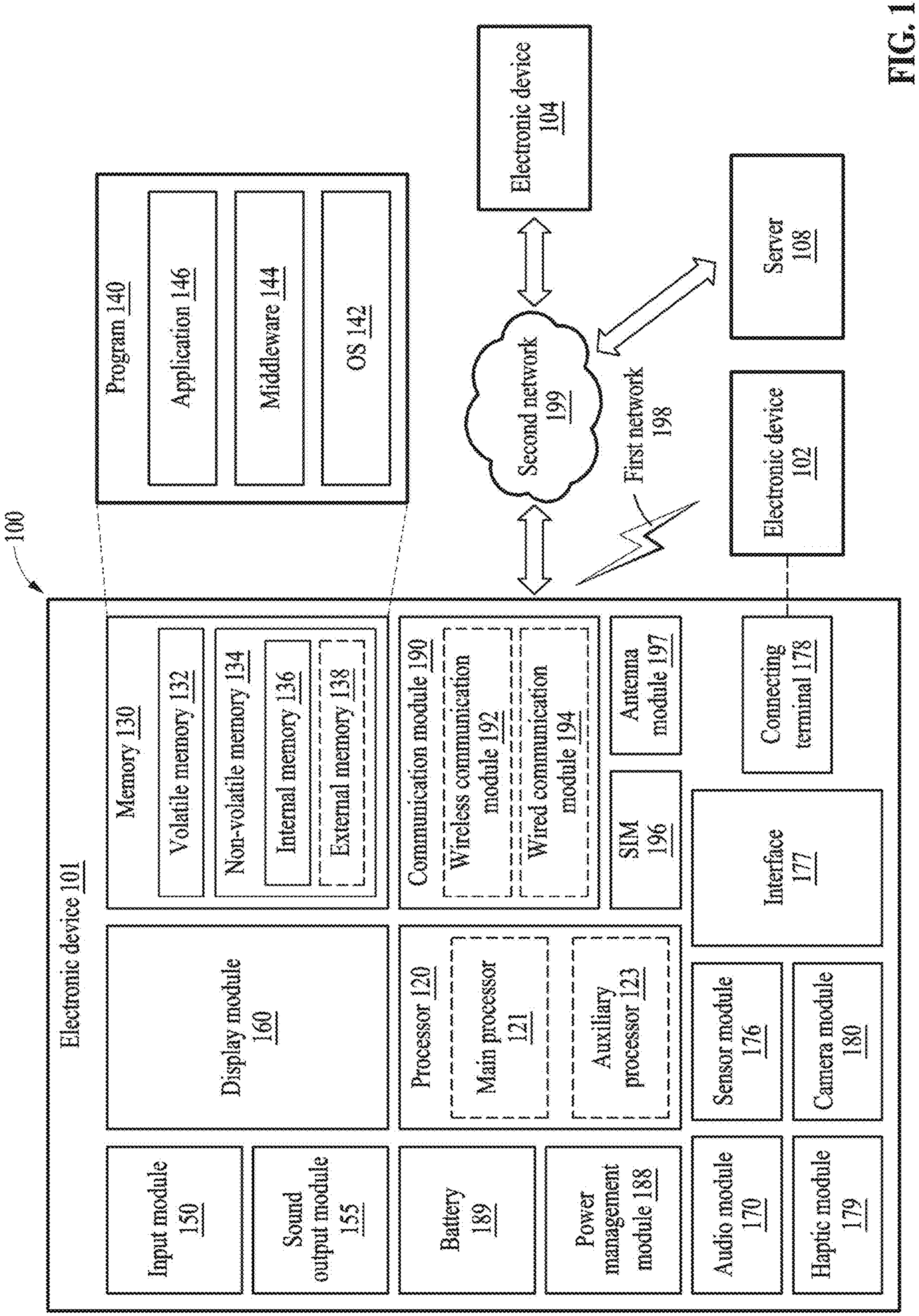
FIG. 1 is a block diagram illustrating an electronic device in a network environment, according to an embodiment of the disclosure.

FIG. 1 is a block diagram illustrating an electronic device in a network environment, according to an embodiment of the disclosure.

Referring to FIG. 1, an electronic device 101 in a network environment 100 may communicate with an electronic device 102 via a first network 198 (e.g., a short-range wireless communication network) or at least one of an electronic device 104 or a server 108 via a second network 199 (e.g., a long-range wireless communication network). In an embodiment, the electronic device 101 may communicate with the electronic device 104 via the server 108. According to another embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be integrated as a single component (e.g., the display module 160).

The processor 120 may be configured to execute, for example, software (e.g., a program 140) to control at least one other component (e.g., a hardware or software component) of the electronic device 101 connected to the processor 120 and may perform various data processing or computation. According to one embodiment, as at least a part of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to another embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. In an example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). In an embodiment, the auxiliary processor 123 (e.g., an ISP or a CP) may be implemented as a portion of another component (e.g., the camera module 180 or the communication module 190) that is functionally related to the auxiliary processor 123. According to another embodiment, the auxiliary processor 123 (e.g., an NPU) may include a hardware structure specified for artificial intelligence model processing. An artificial intelligence model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirectional recurrent deep neural network (BRDNN), and a deep Q-network or a combination of two or more thereof but is not limited thereto. The artificial intelligence model may additionally or alternatively include a software structure other than the hardware structure.

The memory 130 may be configured to store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. In another embodiment, the input module 150 may include, for example, a microphone, a mouse, a keyboard, a key (e.g., a button), or a digital pen (e.g., a stylus pen).

The sound output module 155 may output a sound signal to the outside of the electronic device 101. In another embodiment, the sound output module 155 may include, for example, a speaker or a receiver. The speaker may be used for general purposes, such as playing multimedia or playing a recording. The receiver may be used to receive an incoming call. According to an embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to another embodiment, the display module 160 may include a touch sensor adapted to sense a touch, or a pressure sensor adapted to measure an intensity of a force incurred by the touch.

The audio module 170 may convert a sound into an electric signal or vice versa. According to another embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. In an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to another embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). The connecting terminal 178 may include, for example, a HDMI connector, a USB connector, a SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to another embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to another embodiment, the power management module 188 may be implemented as, for example, at least a part of a power management integrated circuit (PMIC).

The battery 189 may supply power to at least one component of the electronic device 101. In an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to another embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip) or may be implemented as multiple components (e.g., multiple chips) separate from each other. In another embodiment, the wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. In another embodiment, the wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to one embodiment, the antenna module 197 may include an antenna including a radiating element including a conductive material or a conductive pattern formed in or on a substrate (e.g., a printed circuit board (PCB)). According to another embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to yet another embodiment, another component (e.g., a radio frequency integrated circuit (RFIC)) other than the radiating element may be additionally formed as a part of the antenna module 197.

The antenna module 197 may form a mmWave antenna module. According to an embodiment, the mmWave antenna module may include a PCB, a RFIC disposed on a first surface (e.g., the bottom surface) of the PCB or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 and 104 may be a device of the same type as or a different type from the electronic device 101. According to an embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or service, or an additional function or an additional service related to the request and may transfer a result of the performance to the electronic device 101. In another embodiment, the electronic device 101 may provide the result, with or without further processing the result, as at least part of a response to the request. To that end, cloud computing, distributed computing, mobile edge computing (MEC), or client-server computing technology may be used, for example. In still another embodiment, the electronic device 101 may provide ultra-low-latency services using, e.g., distributed computing or mobile edge computing. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to the embodiments disclosed herein may be one of various types of electronic devices. The electronic devices may include, for example, a portable communication device (e.g., a smart phone), a computer device, a portable multimedia device, a portable medical device, a camera, a wearable device, or a home appliance. According to another embodiment, the electronic devices are not limited to those described above.

It should be appreciated that embodiments of the disclosure and the terms used therein are not intended to limit the technological features set forth herein to embodiments and include various changes, equivalents, or replacements for a corresponding embodiment. With regard to the description of the drawings, similar reference numerals may be used to refer to similar or related components. As used herein, “A or B”, “at least one of A and B”, “at least one of A or B”, “A, B or C”, “at least one of A, B and C”, and “A, B, or C,” each of which may include any one of the items listed together in the corresponding one of the phrases, or all possible combinations thereof. Terms such as “first”, “second”, or “first” or “second” may simply be used to distinguish the component from other components in question, and do not limit the components in other aspects (e.g., importance or order). It is to be understood that if an element (e.g., a first element) is referred to, with or without the term “operatively” or “communicatively”, as “coupled with,” “coupled to,” “connected with,” or “connected to” another element (e.g., a second element), it means that the element may be coupled with the other element directly (e.g., by wire), wirelessly, or via a third element.

As used in connection with embodiments of the disclosure, the term “module” may include a unit implemented in hardware, software, or firmware, and may interchangeably be used with other terms, for example, “logic,” “logic block,” “part,” or “circuitry”. A module may be a single integral component, or a minimum unit or part thereof, adapted to perform one or more functions. For example, according to an embodiment, the module may be implemented in a form of an application-specific integrated circuit (ASIC).

Embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. The term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

In an embodiment, a method according to embodiments of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to other embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to still other embodiments, operations performed by the module, the program, or another component may be carried out sequentially, in parallel, repeatedly, or heuristically, or one or more of the operations may be executed in a different order or omitted, or one or more other operations may be added.

Figure 2A:
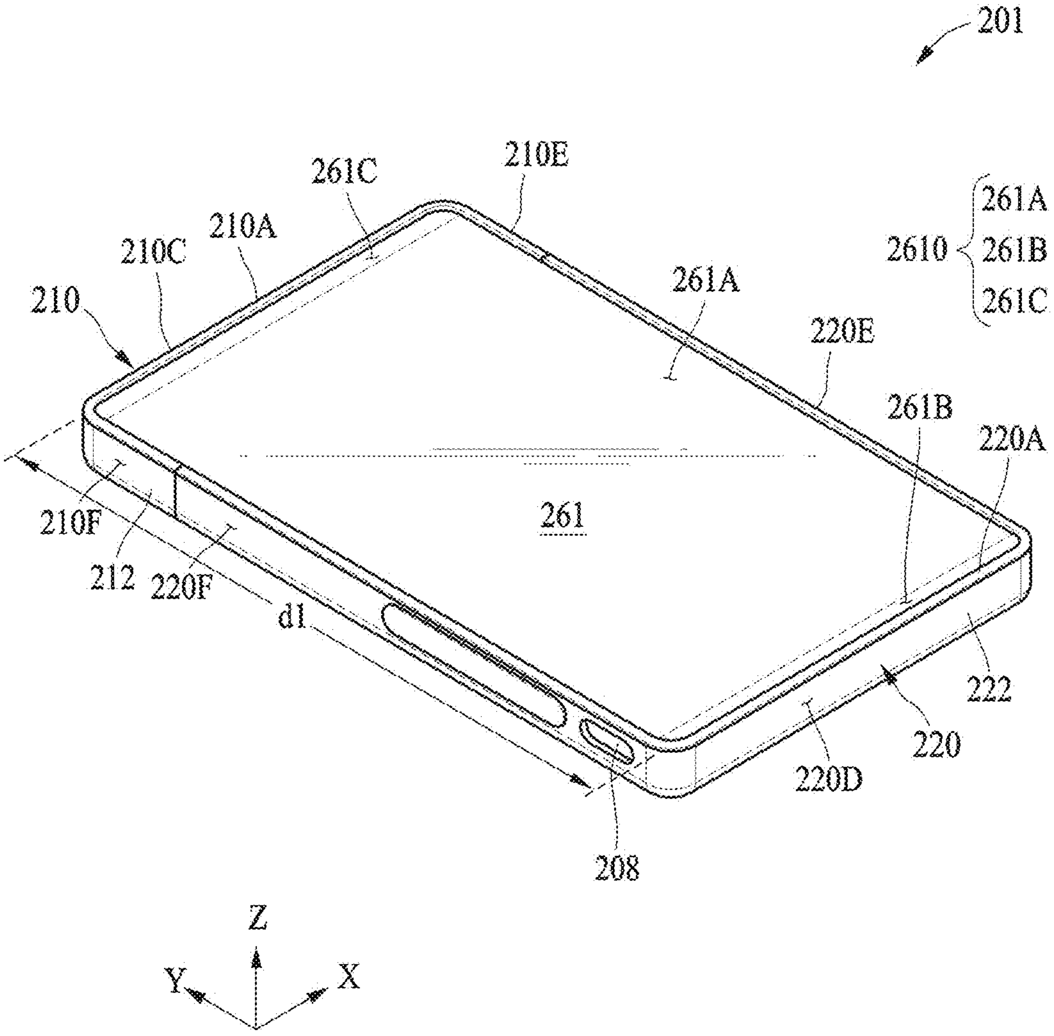
FIG. 2A is a front perspective view illustrating a first state of an electronic device according to an embodiment of the disclosure.
Figure 2B:
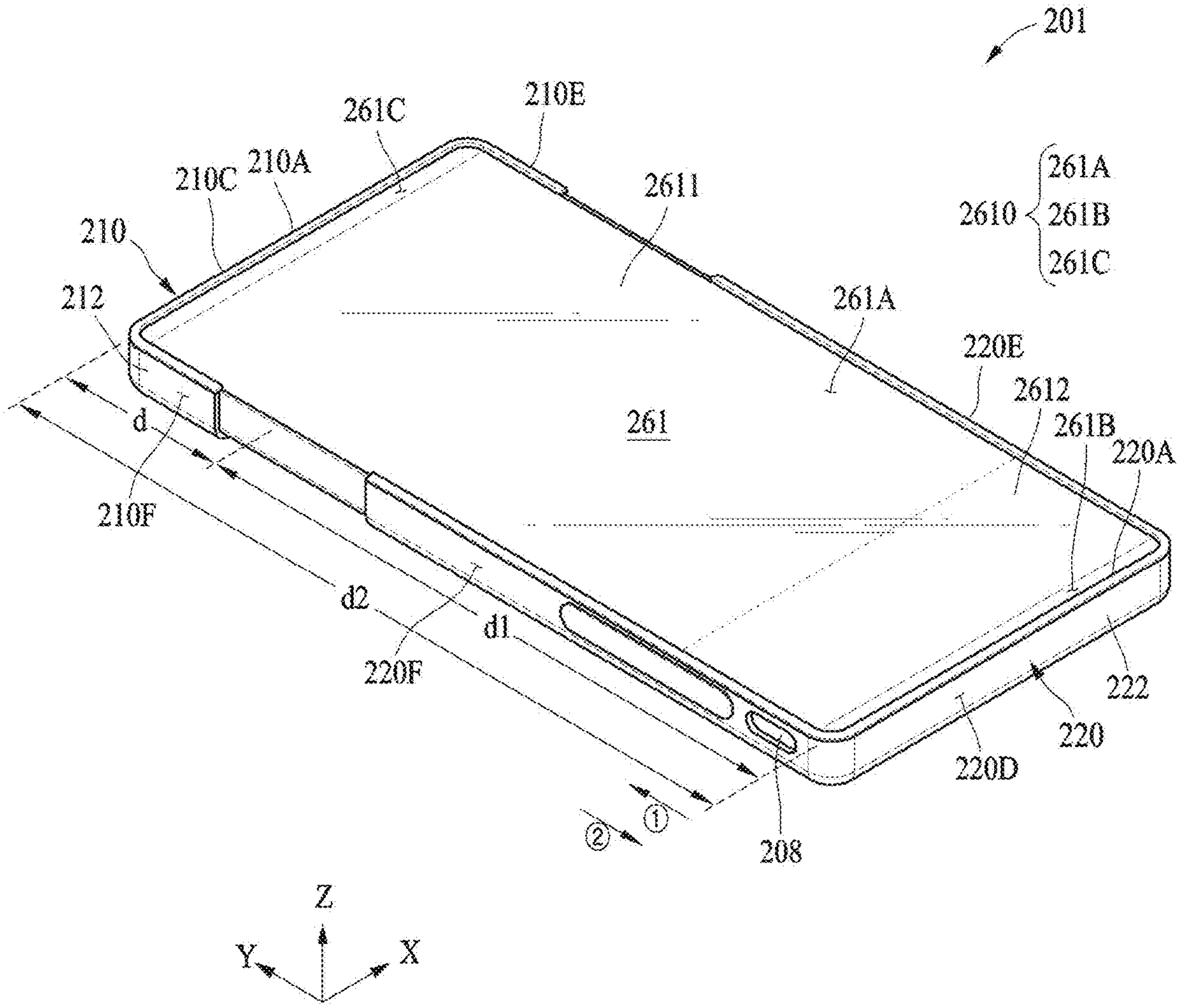
FIG. 2B is a front perspective view illustrating a second state of the electronic device according to an embodiment of the disclosure.
Figure 2C:
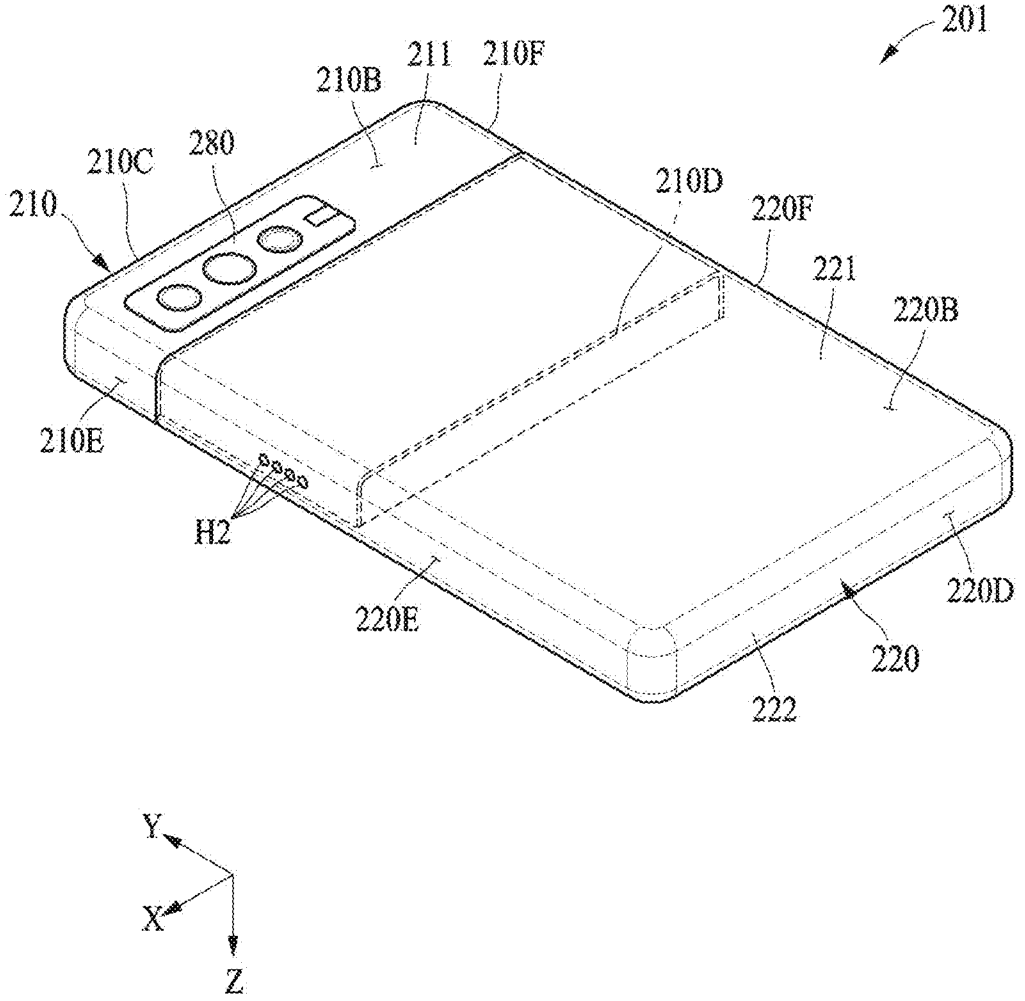
FIG. 2C is a rear perspective view illustrating a first state of the electronic device according to an embodiment of the disclosure.
Figure 2D:
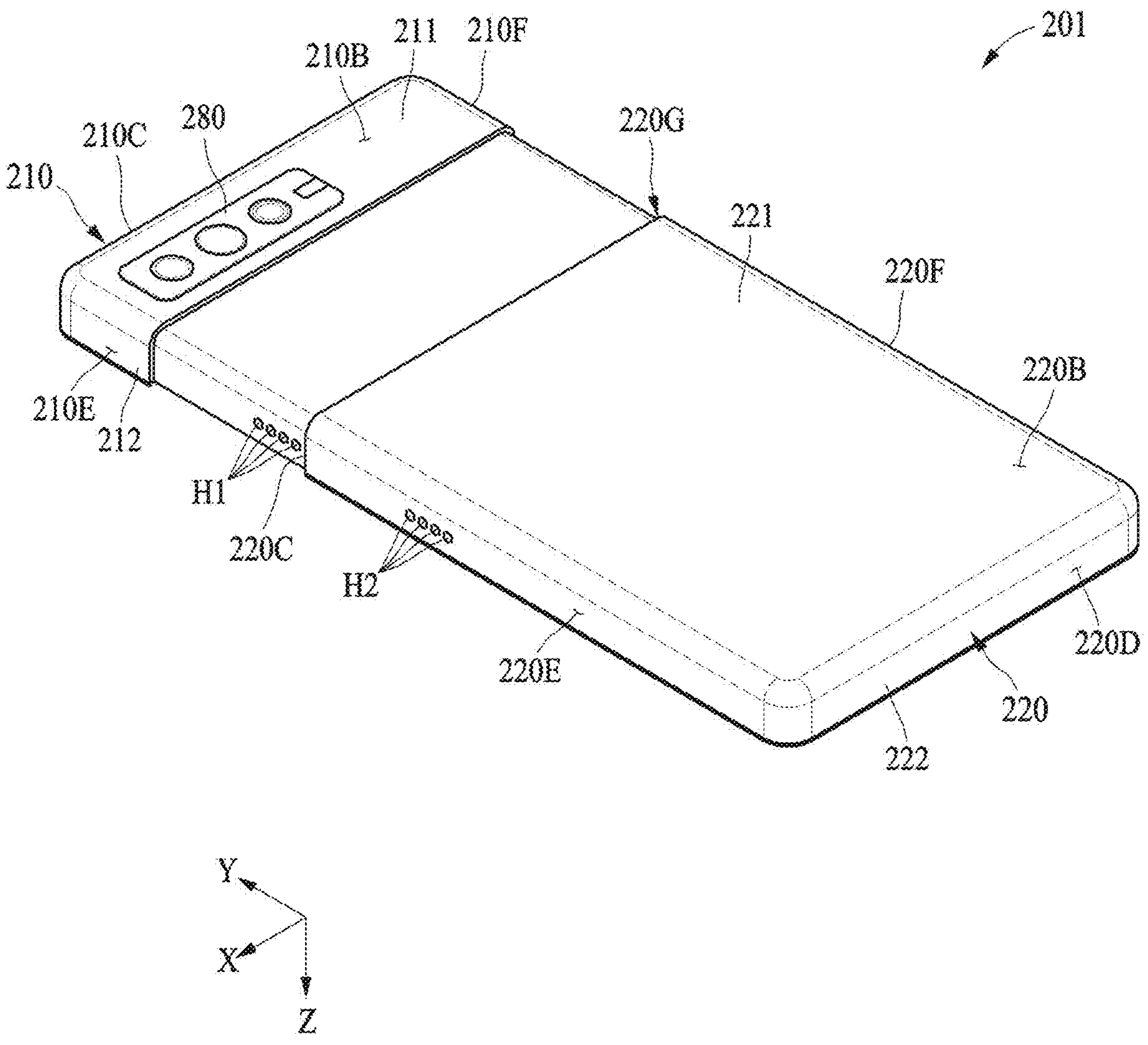
FIG. 2D is a rear perspective view illustrating a second state of the electronic device according to an embodiment of the disclosure.

FIG. 2A is a front perspective view illustrating a first state of an electronic device according to an embodiment of the disclosure. FIG. 2B is a front perspective view illustrating a second state of the electronic device according to an embodiment of the disclosure. FIG. 2C is a rear perspective view illustrating the first state of the electronic device according to an embodiment of the disclosure. FIG. 2D is a rear perspective view illustrating the second state of the electronic device according to an embodiment of the disclosure.

Referring to FIGS. 2A to 2D, an electronic device 201, according to an embodiment, includes housings 210 and 220 that form an exterior and accommodate components inside. In one embodiment, the housings 210 and 220 may include a first housing 210 and a second housing 220 that are movably coupled to each other. In an embodiment, the first housing 210 may be slidably connected to the second housing 220. For example, the first housing 210 may move relative to the second housing 220 in a first moving direction (direction ①) (e.g., a +Y direction) or may be movably connected to the second housing 220 in a second moving direction (direction ②) (e.g., a −Y direction) that is opposite to the first moving direction (direction ①). Hereinafter, in an embodiment provided herein, the first housing 210 is described as moving relative to the second housing 220, but this is for the description of the relative movement of the first housing 210 and the second housing 220 to each other. Thus, it could also be understood that the second housing 220 moves relative to the first housing 210.

In another embodiment, according to the relative movement of the first housing 210 to the second housing 220, a state of the electronic device 201 may change between the first state and the second state. In an embodiment, the electronic device 201 may have a reduced shape in the first state and an extended shape in the second state. The electronic device 201 may be used in the first state or the second state or may be used in an intermediate state between the first state and the second state.

The first housing 210 may include a first surface 210A (e.g., a first front surface), a second surface 210B (e.g., a first rear surface) opposite to the first surface 210A, a first side surface 210C facing a first lateral direction (e.g., the +Y direction) and positioned between the first surface 210A and the second surface 210B, a second side surface 210D facing a second lateral direction (e.g., the −Y direction) opposite to the first lateral direction and positioned between the first surface 210A and the second surface 210B, a third side surface 210E facing a third lateral direction (e.g., an +X direction) crossing the first lateral direction and positioned between the first surface 210A and the second surface 210B, and a fourth side surface 210F facing a fourth lateral direction (e.g., a −X direction) opposite to the third lateral direction and positioned between the first surface 210A and the second surface 210B. In an embodiment, the first housing 210 may include a body frame 211 and a first side frame 212 extending substantially in a thickness direction (e.g., a Z-axis direction) along the edge of the body frame 211. In another embodiment, the body frame 211 may form the second surface 210B, and the first side frame 212 may form the first side surface 210C, the second side surface 210D, the third side surface 210E, and the fourth side surface 210F. In an embodiment, the body frame 211 and the first side frame 212 may be integrally formed or may be separately formed to be coupled to each other.

According to an embodiment, the second housing 220 may include a third surface 220A (e.g., a second front surface), a fourth surface 220B (e.g., a second rear surface) opposite to the third surface 220A, a fifth side surface 220C facing the first lateral direction (e.g., the +Y direction) and positioned between the third surface 220A and the fourth surface 220B, a sixth side surface 220D facing the second lateral direction (e.g., the −Y direction) opposite to the first lateral direction and positioned between the third surface 220A and the fourth surface 220B, a seventh side surface 220E facing the third lateral direction (e.g., the +X direction) crossing the first lateral direction and positioned between the third surface 220A and the fourth surface 220B, and an eighth side surface 220F facing the fourth lateral direction (e.g., the −X direction) opposite to the third lateral direction and positioned between the third surface 220A and the fourth surface 220B. In an embodiment, the second housing 220 may include a second cover 221 and a second side frame 222 extending substantially in the thickness direction (e.g., the Z-axis direction) along the edge of the second cover 221. In an embodiment, the second cover 221 may form the fourth surface 220B, and the second side frame 222 may form the fifth side surface 220C, the sixth side surface 220D, the seventh side surface 220E, and the eighth side surface 220F. The second cover 221 and the second side frame 222 may be integrally formed or may be separately formed to be coupled to each other.

In another embodiment, the first housing 210 and the second housing 220 may form a front surface (e.g., a surface facing a +Z direction) of the electronic device 201 through the first surface 210A and the third surface 220A and may form a rear surface (a surface facing a −Z direction) of the electronic device 201 through the second surface 210B and the fourth surface 220B. In an embodiment, the second housing 220 may include an open portion 220G in which at least a portion of the fifth side surface 220C is open such that the first housing 210 may be partially movably inserted into the second housing 220. However, this is just an example, and, in an embodiment, the first housing 210 may include an open portion in which at least a portion of the second side surface 210D is open, and the second housing 220 may be partially movably inserted into the first housing 210 through the open portion formed in the second side surface 210D.

In still another embodiment, the electronic device 201 may include a display 261 (e.g., a flexible display or a rollable display) for displaying visual information. In an embodiment, the display 261 may be visually exposed to the outside of the electronic device 201 through a display area 2610. In an embodiment, the display area 2610 may include a first area 261A provided parallel to the first surface 210A and the third surface 220A, a second area 261B connected to one end of the first area 261A, and a third area 261C connected to the other end of the first area 261A. The second area 261B and the third area 261C may be provided on opposite sides based on the first area 261A. In an embodiment, each of the second area 261B and the third area 261C may form a flexibly curved surface. The display 261 may display a screen through the display area 2610. The display 261 may display one connected screen through the whole display area 2610 and may display a screen through a portion of the display area 2610. In an embodiment, the display 261 may display a plurality of screens partially divided through the display area 2610. In an example, the display 261 may display one screen through the first area 261A and may display another screen, which is different from the screen displayed through the first area 261A, through the second area 261B and/or the third area 261C.

The display 261 may include a flat portion 2611 forming at least a portion of the display area 2610 and a rolling portion 2612 extending from the flat portion 2611. The rolling portion 2612 may be withdrawn from the inside to the outside of the electronic device 201 or may be inserted from the outside to the inside of the electronic device 201 according to the movement of the first housing 210 relative to the second housing 220. The rolling portion 2612 that is withdrawn to the outside of the electronic device 201 may be visually exposed to the outside of the electronic device 201 and may form the display area 2610 with the flat portion 2611. The area of the display area 2610 may change according to the degree of withdrawal of the rolling portion 2612.

According to an embodiment, the area of the display area 2610 (e.g., the first area 261A, the second area 261B, and the third area 261C) of the display 261 may change according to a change in a state of the electronic device 201. In an embodiment, the display area 2610 of the display 261 may form a first area (e.g., a minimum area) reduced to the minimum in the first state (e.g., the reduced state or the shape of FIG. 2A) of the electronic device 201 and may form a second area (e.g., a maximum area) extended to the maximum in the second state (e.g., the extended state or the shape of FIG. 2C) of the electronic device 201. The first housing 210 and the second housing 220 may switch a state between the extended state and the reduced state. For example, the extended state refers to a maximally slid-out state of the first housing 210 from the second housing 220. The reduced state refers to a maximally slid-in state of the first housing 210 to the inside of the second housing 220. When the electronic device 201 is between the first state and the second state, the display 261 may expand or reduce the area of the display area 2610, corresponding to the state of the electronic device 201. For example, while changing from the first state to the second state, when the first housing 210 moves relative to the second housing 220 in the first moving direction (direction ①) by a certain length d, the length of the display area 2610 that is parallel to the first moving direction (direction ①) changes to a second length d2 increasing by the certain length d from a first length d1 such that the display area 2610 may be extended. While changing from the second state to the first state, when the first housing 210 moves relative to the second housing 220 in the second moving direction (direction ②) by the certain length d, the length of the display area 2610 that is parallel to the second moving direction (direction ②) changes to the first length d1 decreasing by the certain length d from the second length d2 such that the display area 2610 may be reduced. While the electronic device 201 changes the state between the first state and the second state, the size of the second area 261B and the size of the third area 261C may be substantially constant.

According to another embodiment, the electronic device 201 may include at least one of an input module (e.g., the input module 150 of FIG. 1), a sound output module (e.g., the sound output module 155 of FIG. 1), a camera module 280 (e.g., the camera module 180 of FIG. 1), or a connector port 208.

In yet another embodiment, the input module may receive an input signal according to the manipulation of a user. The input module may be, for example, on the seventh side surface 220E or the eighth side surface 220F of the second housing 220. It should be noted that positions in which the input module is are not limited thereto. For example, the input module may also be in the first housing 210.

At least one housing between the first housing 210 and the second housing 220 may include a hole for radiating sound generated by the sound output module to the outside. For example, the first housing 210 may include a first hole H1 that is covered by the second housing 220 when the electronic device 201 is in the first state and that is exposed to the outside when the electronic device 201 is in the second state. For example, the second housing 220 may include a second hole H2 formed in at least one of the sixth side surface 220D, the seventh side surface 220E, or the eighth side surface 220F. In another example, the first hole H1 and the second hole H2 may be substantially aligned with each other when the electronic device 201 is in the first state.

Figure 3:
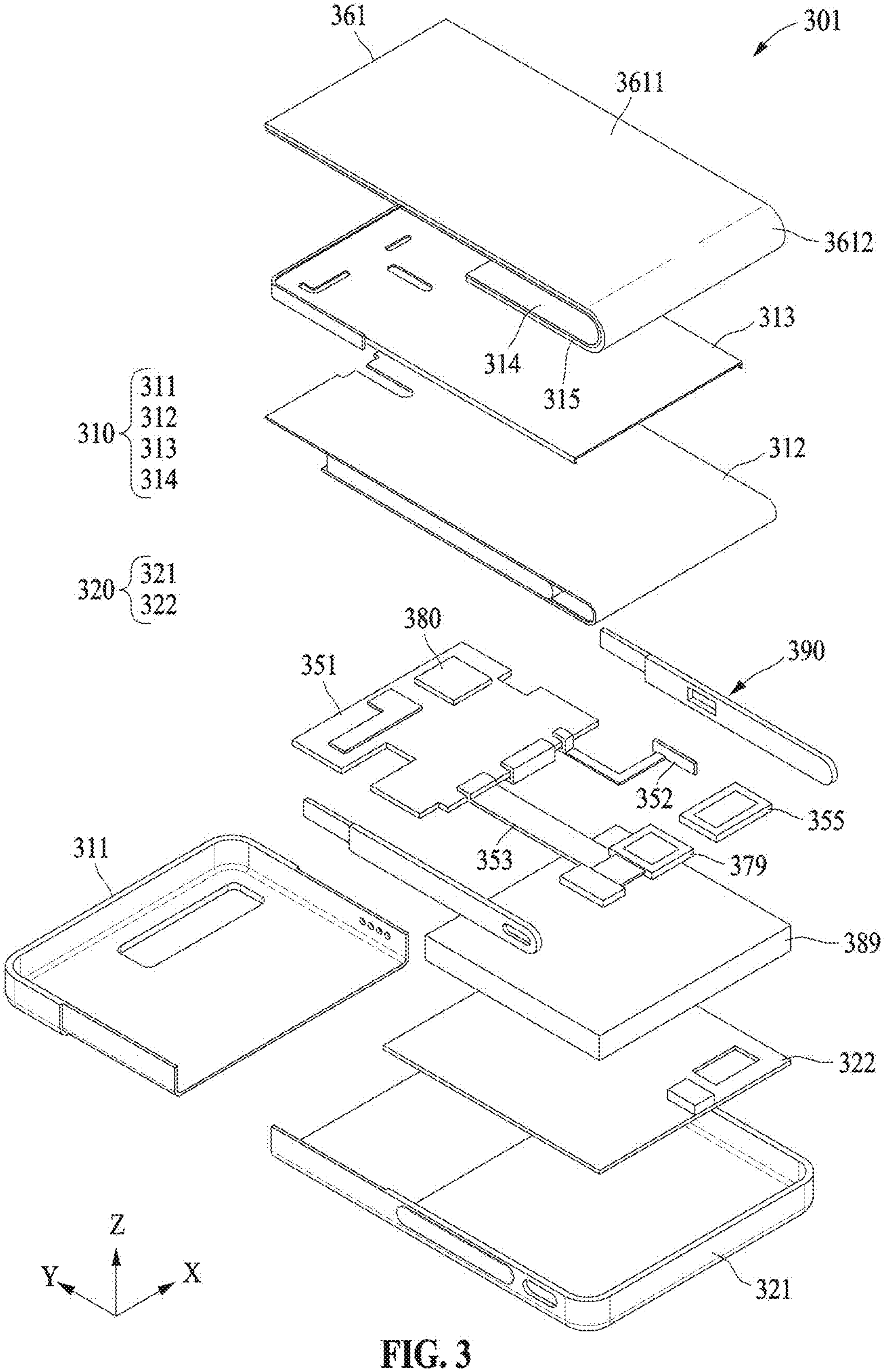
FIG. 3 is an exploded perspective view of the electronic device according to an embodiment of the disclosure.

FIG. 3 is an exploded perspective view of the electronic device according to an embodiment of the disclosure.

Referring to FIG. 3, an electronic device 301, according to an embodiment, may include a first housing 310 (e.g., a first housing 210 of FIG. 2B), a second housing 320 (e.g., a second housing 220 of FIG. 2B), and a display 361 (e.g., a display 261 of FIG. 2B).

The electronic device 301 may include an actuator 390 configured to move the first housing 310 and the second housing 320 relative to each other. In an embodiment, the actuator 390 may be in the first housing 310 or the second housing 320. The actuator 390 may provide power required to move the first housing 310 relative to the second housing 320. The actuator 390 may include, for example, an electric motor, a hydraulic motor, and any other motors suitable for generating power.

In another embodiment, the electronic device 301 may include a sound output module 355 (e.g., the sound output module 155 of FIG. 1). In an embodiment, the sound output module 355 may be in the first housing 310 or the second housing 320.

According to yet another embodiment, the electronic device 301 may include a haptic module 379 (e.g., the haptic module 179 of FIG. 1). The haptic module 379 may include, for example, a vibrator configured to generate vibrations. In an embodiment, the haptic module 379 may be in the second housing 320. In some embodiments, the haptic module 379 may be adjacent to the sound output module 355. In an embodiment, the haptic module 379 may be in the first housing 310.

In an embodiment, the electronic device 301 may include a camera module 380 (e.g., the camera module 180 of FIG. 1). The camera module 380 may include at least one camera to obtain an image of one direction (e.g., the +Z direction) or another direction (e.g., the −Z direction) of the electronic device 301.

The electronic device 301 may include a battery 389 (e.g., the battery 189 of FIG. 1). In an embodiment, the battery 389 may be in the second housing 320. In an embodiment, the battery 389 may be in the first housing 310.

The electronic device 301 may include a first PCB 351, a second PCB 352, and a third PCB 353. The first PCB 351, the second PCB 352, and the third PCB 353 may include a plurality of metal layers and a plurality of dielectrics each positioned between a pair of adjacent metal layers. In an embodiment, the first PCB 351 may be in the first housing 310. The first PCB 351 may include a first electronic component (e.g., the power management module 188 of FIG. 1). The second PCB 352 may be in the first housing 310. The second PCB 352 may be electrically connected, for example, to the actuator 390. The third PCB 353 may be in the second housing 320. The third PCB 353 may be electrically connected, for example, to the haptic module 379.

In one embodiment, the first housing 310 may include a first cover 311, a body frame 312, a sliding plate 313, and a plurality of support bars 314 and 315. The second housing 320 may slidably support the first housing 310. The second housing 320 may surround at least a portion of the first cover 311 and may be connected to the body frame 312. The second housing 320 may include a second cover 321 and a third plate 322. The first cover 311 may at least partially surround a first sound output module 355A, a first camera module 380A, the haptic module 379, and a second sound output module 355B. The body frame 312 may be fixed to the second cover 321. The body frame 312 may slidably support the sliding plate 313. The sliding plate 313 may linearly move along the body frame 312. The body frame 312 may at least partially accommodate electronic components (e.g., the actuator 390, the sound output module 355, the camera module 380, the first PCB 351, the second PCB 352, the third PCB 353, the haptic module 379, and other electronic components). The sliding plate 313 may be fixed to the first cover 311. The sliding plate 313 may slide along the body frame 312. The sliding plate 313 may be between the body frame 312 and the display 361 and may support the actuator 330 and the display 361. The plurality of support bars 314 may be spaced apart from one another along the display 361. When the sliding plate 313 moves in a Y-axis direction, the display 361 may move together with the sliding plate 313, with at least a portion of the display 361 being fixed to the sliding plate 313. While the display 361 is moving, the size of an externally displayed area of the display 361 may change. While the display 361 is moving, the position of a curved portion of the display 361 may change.

In still another embodiment, the display 361 may include a flat portion 3611 that maintains a flat shape and a rolling portion 3612 that changes in shape. The rolling portion 3612 may include an exposed area that is visually exposed to the outside and a non-exposed area that is not visually exposed to the outside when the first housing 310 and the second housing 320 are in an extended state. When the first housing 310 and the second housing 320 are in the extended state, the non-exposed area may be in a curved shape. The plurality of support bars 314 may be in the rolling portion 3612. The second cover 321 may support the body frame 312. The second cover 321 may at least partially surround the first cover 311. The second cover 321 may be slidably coupled to the first cover 311. The second cover 321 may fix the body frame 312. The body frame 312 may be connected to the second cover 321. The second cover 321 may expose at least a portion (e.g., the camera module 380) of the electronic components to the outside of the electronic device 301. The third plate 322 may be inside the second cover 321. The third plate 322 may support various electronic components. Meanwhile, the structures of the first housing 310 and the second housing 320 described herein are not limited to the shown embodiments, and there may be structures in various shapes.

In one embodiment, the electronic device 301 may include at least one antenna (not shown). For example, the at least one antenna may wirelessly communicate with an external electronic device (e.g., the electronic device 104 of FIG. 1) or may wirelessly transmit and receive power required for charging. According to an embodiment, the at least one antenna may include a legacy antenna, a mmWave antenna, a near field communication (NFC) antenna, a wireless charging antenna, and/or a magnetic secure transmission (MST) antenna. In another embodiment, the first housing 310 and the second housing 320 may include a conductive portion of which at least a portion is formed of metal to form an antenna structure that performs radiator functions.

Figure 4A:
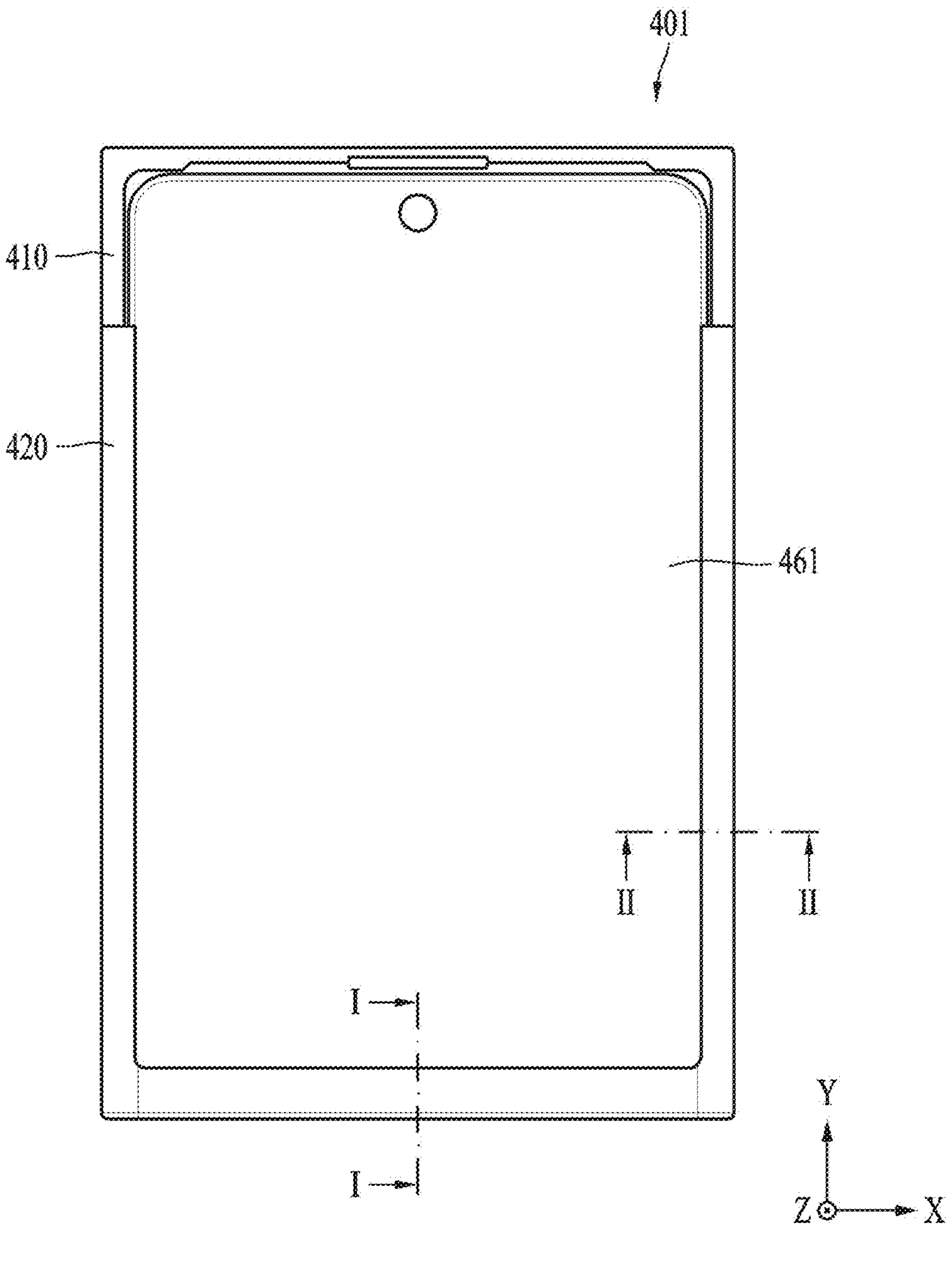
FIG. 4A is a plan view of the electronic device according to an embodiment of the disclosure.
Figure 4B:
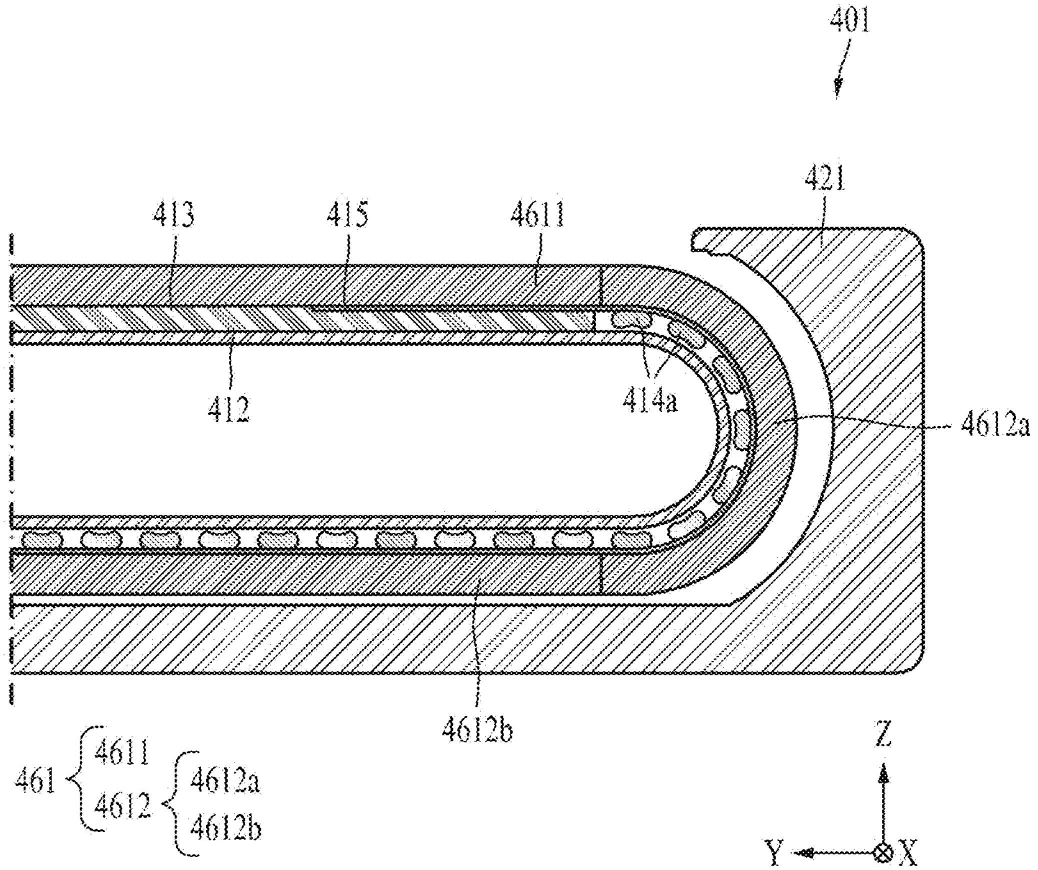
FIG. 4B is a cross-sectional view, illustrating an electronic device, taken along the cutting line I-I of FIG. 4A according to an embodiment of the disclosure.
Figure 4C:
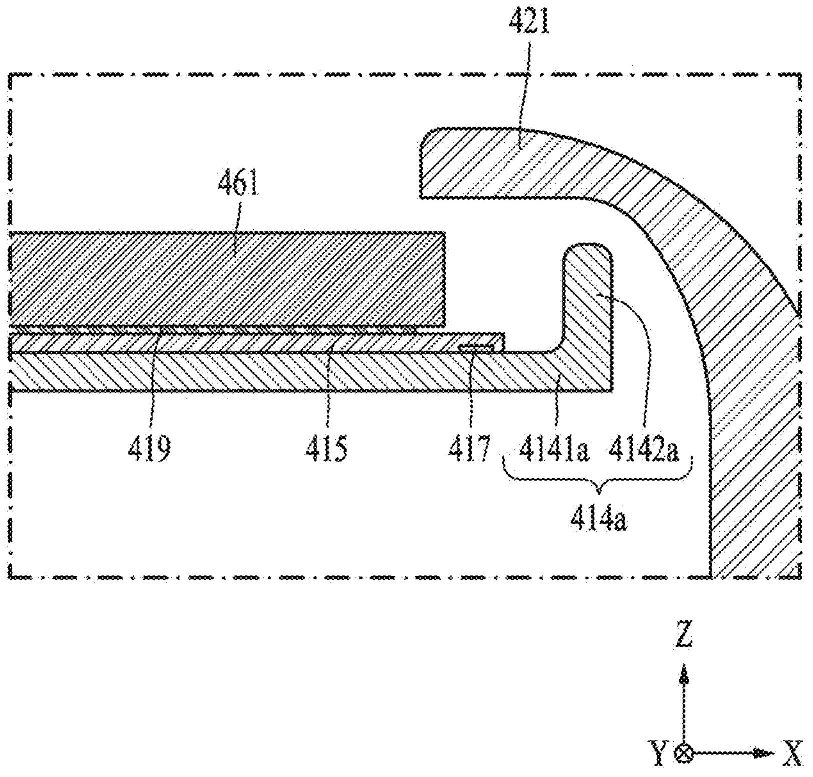
FIG. 4C is a cross-sectional view, illustrating the electronic device, taken along the cutting line II-II of FIG. 4A according to an embodiment of the disclosure.
Figure 4D:
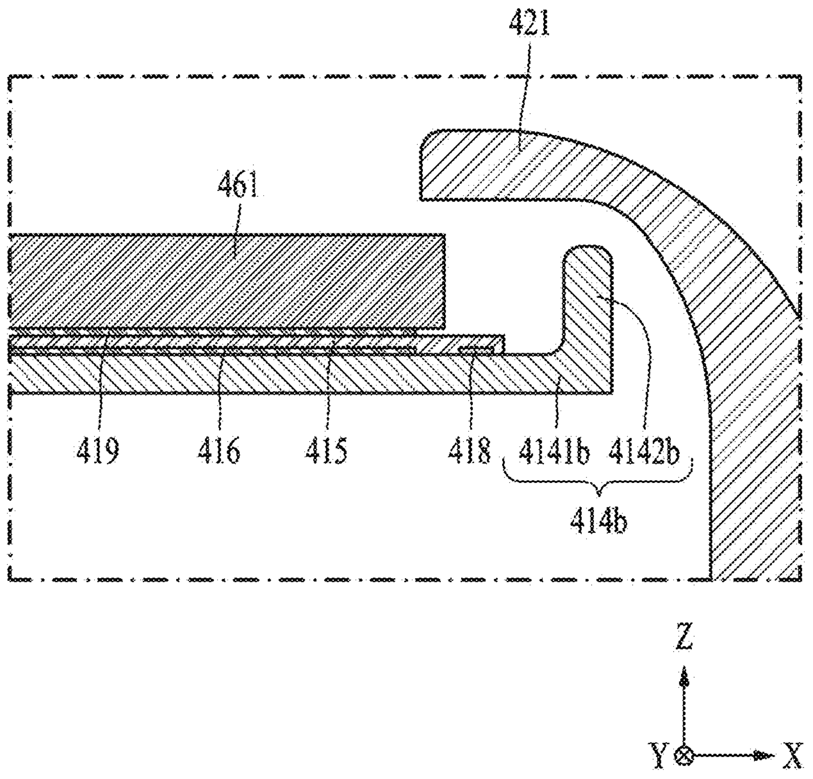
FIG. 4D is a cross-sectional view of the electronic device according to an embodiment of the disclosure.

FIG. 4A is a plan view of the electronic device according to an embodiment of the disclosure. FIG. 4B is a cross-sectional view, illustrating an electronic device, taken along the cutting line I-I of FIG. 4A according to an embodiment of the disclosure. FIG. 4C is a cross-sectional view, illustrating the electronic device, taken along the cutting line II-II of FIG. 4A according to an embodiment of the disclosure. FIG. 4D is a cross-sectional view of the electronic device according to an embodiment of the disclosure.

Referring to FIGS. 4A to 4D, an electronic device 401 (e.g., an electronic device 101 of FIG. 1, an electronic device 201 of FIG. 2A, or an electronic device 301 of FIG. 3) may include a first housing 410 and a second housing 420. The first housing 410 (e.g., a first housing 210 of FIG. 2A) and the second housing 420 (e.g., a second housing 220 of FIG. 2A) may switch a state between an extended state and a reduced state. FIG. 4A illustrates that the first housing 410 and the second housing 420 are in the reduced state. A display 461 (e.g., a display 261 of FIG. 2A) may be transformed according to the switching of the state of the first housing 410 and the second housing 420. The display 461 may include a flat portion 4611 (e.g., a flat portion 2611 of FIG. 2B) and a rolling portion 4612 (e.g., a rolling portion 4612 of FIG. 2B). The rolling portion 4612 may include an exposed area **4612*a* that is visually exposed to the outside and a non-exposed area 4612*b* that is not visually exposed to the outside when the first housing 410 and the second housing 420 are in the extended state. In the drawings, for ease of description, the flat portion 4611, the exposed area 4612*a*, and the non-exposed area 4612*b* are divided by solid lines, but these components are not physically divided in practice. The flat portion 4611, the exposed area 4612*a*, and the non-exposed area 4612*b* may be formed integrally. The flat portion 4611, the exposed area 4612*a*, and the non-exposed area 4612*b*** may be one body.

The first housing 410 may include a first cover (e.g., the first cover 311 of FIG. 3), a sliding plate 413 (e.g., the sliding plate 313 of FIG. 3), and a body frame 412 (e.g., the body frame 312 of FIG. 3). The second housing 420 may include a second cover 421 (e.g., the second cover 321 of FIG. 3). The electronic device 401 may include a lattice plate 415 that is connected to the display 461. A plurality of holes may be formed through the lattice plate 415. The lattice plate 415 may support the display 461. The lattice plate 415 may be transformable.

The display 461 may be connected to the sliding plate 413 and may be transformable. The display 461 may be transformed while the first housing 410 and the second housing 420 switch the state. The display 461 may include the flat portion 4611 that maintains a flat shape and the rolling portion 4612 that changes in shape.

In an embodiment, the electronic device 401 may include a plurality of first support bars **414*a* connected to the exposed area 4612*a* of the display 461 and a plurality of second support bars 414*b* connected to the non-exposed area 4612*b* of the display 461. The plurality of first support bars 414*a* may be spaced apart from one another. The longitudinal direction of the first support bar 414*a* may be an X-axis direction. The plurality of first support bars 414*a* may be arranged in the sliding direction of the display 461**.

At least a portion of the lattice plate 415 may be inserted between the display 461 and the sliding plate 413. A portion of the lattice plate 415 may overlap the sliding plate 413. The sliding plate 413 may include a stainless-steel material.

The electronic device 401 may include a first welded part 417 that connects the plurality of first support bars **414*a* to the lattice plate 415 and a second welded part 418 that connects the plurality of second support bars 414*b* to the lattice plate 415. In another embodiment, the first support bar 414*a*, the second support bar 414*b*, and/or the lattice plate 415 may be formed of metal. For example, the first support bar 414*a* and the second support bar 414*b* may be formed of the same metal material. In another example, the lattice plate 415 may be formed of the same metal material as or a different metal material from that of the first support bar 414*a* and/or the second support bar 414*b***.

The first welded part 417 may be provided as a pair of first welded parts. The pair of first welded parts 417 may be spaced apart from each other in the X-axis direction. A first welded part of the pair of first welded parts 417 may be at an end of the first support bar **414*a*. The other first welded part (not shown) of the pair of first welded parts 417 may be at the other end of the first support bar 414*a*. Here, the end of the first support bar 414*a* is an end on a +X side and the other end of the first support bar 414*a*** is an end on a −X side.

A separate adhesive layer may not be between the pair of first welded parts 417. An adhesive layer may not be in the plurality of first support bars **414*a* connected to the exposed area 4612*a*. In this structure, in the extended state, a phenomenon in which the first support bar 414***a* is faintly visually exposed to the outside through the exposed area 4612*a*.

The first welded part 417 may be generated by irradiating a laser to the lattice plate 415 while the lattice plate 415 is arranged in the first support bar 414*a*. When the laser is irradiated to the lattice plate 415, a portion of the lattice plate 415 may be melted. The melted portion of the lattice plate 415 may be hardened and coupled to the first support bar 414*a*. For example, the first welded part 417 may be formed of the same material as that of the lattice plate 415.

The first support bar 414*a* may include a first support bar body 4141*a* that supports the lattice plate 415 and a first support bar arm 4142*a* protruding from the first support bar body 4141*a*. For example, the first support bar arm 4142*a* may reduce or prevent the infiltration of particles, dust, and/or moisture into an area inside the second cover 421.

The electronic device 401 may include a connecting layer 419 that connects the lattice plate 415 to the display 461. The connecting layer 419 may include an adhesive.

The second welded part 418 may be provided as a pair of second welded parts. The pair of second welded parts 418 may be spaced apart from each other in the X-axis direction. A second welded part of the pair of second welded parts 418 may be at an end of the second support bar 414*b*. The other second welded part (not shown) of the pair of second welded parts 418 may be at the other end of the second support bar 414*b*. The end of the second support bar 414*b* is an end on a +X side, and the other end of the second support bar 414*b* is an end on a −X side.

There may be an adhesive layer 416 between the pair of second welded parts 418. According to an embodiment, the adhesive layer 416 may be stated as a compression layer.

The second welded part 418 may be generated by irradiating a laser to the lattice plate 415 while the lattice plate 415 is arranged in the second support bar 414*b*. When the laser is irradiated to the lattice plate 415, a portion of the lattice plate 415 may be melted. The melted portion of the lattice plate 415 may be hardened and coupled to the second support bar 414*b*. In an example, the second welded part 418 may be formed of the same material as that of the lattice plate 415.

The second support bar 414*b* may include a second support bar body 4141*b* that supports the lattice plate 415 and a second support bar arm 4142*b* protruding from the second support bar body 4141*b*. The second support bar arm 4142*b* may reduce or prevent the infiltration of particles, dust, and/or moisture into an area inside the second cover 421.

The first welded part 417 may overlap the second cover 421 based on the Z-axis direction. The second welded part 418 may overlap the second cover 421 based on the Z-axis direction.

Figure 5A:
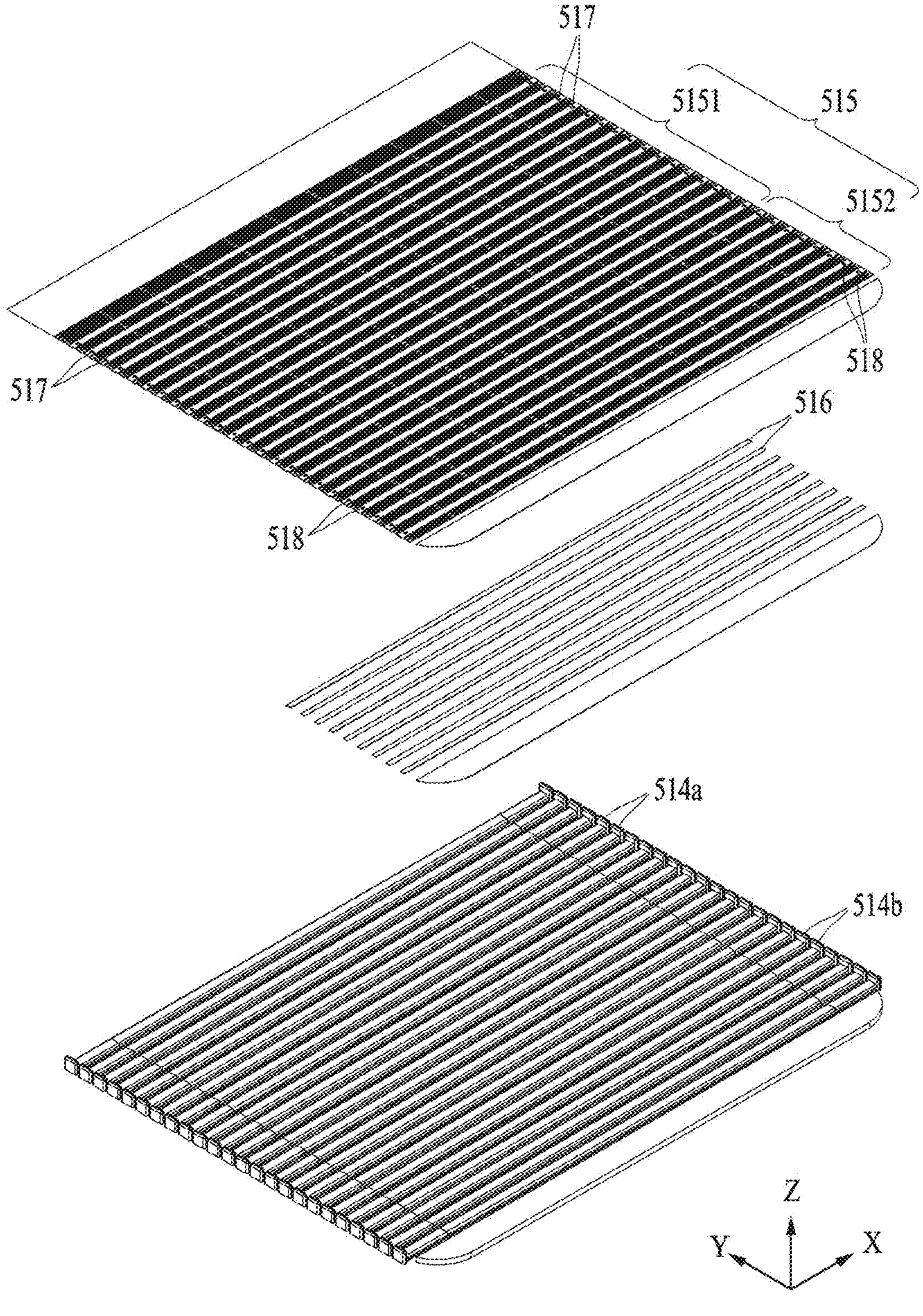
FIG. 5A is an exploded perspective view schematically illustrating a lattice plate, an adhesive layer, and a plurality of support bars, according to an embodiment of the disclosure.
Figure 5B:
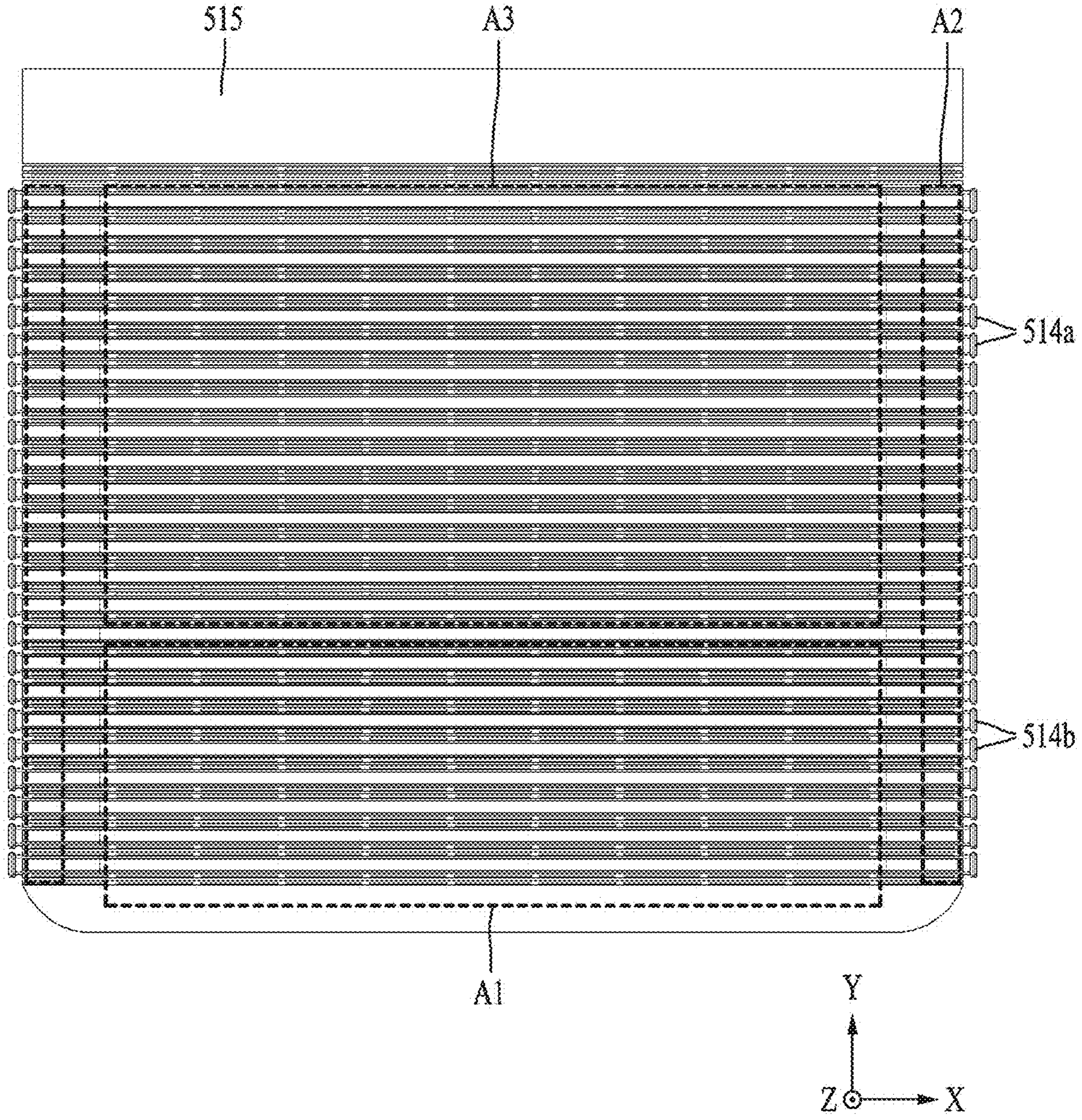
FIG. 5B is a plan view schematically illustrating the plurality of support bars according to an embodiment of the disclosure.
Figure 5C:
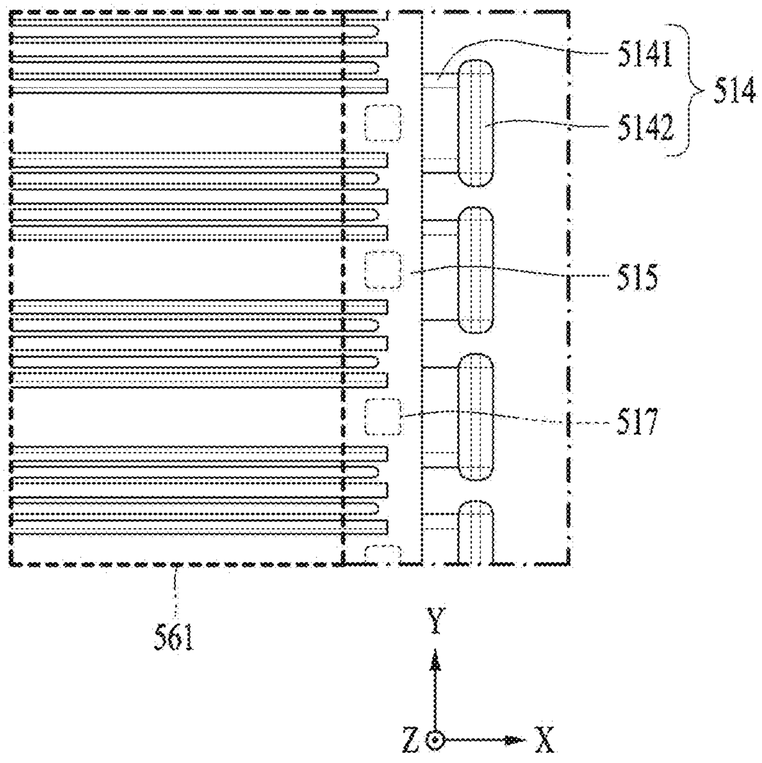
FIG. 5C is a plan view schematically illustrating the adhesive layer and the plurality of support bars, according to an embodiment of the disclosure.

FIG. 5A is an exploded perspective view schematically illustrating a lattice plate, an adhesive layer, and a plurality of support bars, according to an embodiment of the disclosure. FIG. 5B is a plan view schematically illustrating the plurality of support bars according to an embodiment of the disclosure. FIG. 5C is a plan view schematically illustrating the adhesive layer and the plurality of support bars, according to an embodiment of the disclosure.

Referring to FIGS. 5A to 5C, a lattice plate 515 may include a first lattice portion 5151 that is connected to an exposed area of a display and a second lattice portion 5152 that is connected to a non-exposed area of the display. A first welded part 517 may be at both ends of the first lattice portion 5151. A first welded part 517 may connect the first lattice portion 5151 to a first support bar 514*a*. For ease of description, the first welded part 517 is illustrated as being on the first lattice portion 5151, but the first welded part 517 is actually between the first lattice portion 5151 and the first support bar 514*a*. The first welded part 517 may be a hardened portion after a portion of the first lattice portion 5151 has been melted. A second welded part 518 may be at both ends of the second lattice portion 5152. The second welded part 518 may, for example, connect the second lattice portion 5152 to a second support bar 514*b*.

The second lattice portion 5152 and the second support bar 514*b* may be further connected by an adhesive layer 516. The second lattice portion 5152 and the second support bar 514*b* may be connected to each other by the second welded part 518, and the central portions of the second lattice portion 5152 and the second support bar 514*b* may be connected to each other by the adhesive layer 516. Through the double connection structure, the second lattice portion 5152 and the second support bar 514*b* may remain attached to each other further stably. In this structure, in an extended state, the unintended partial separation of the lattice plate 515 and the second support bar 514*b* may be reduced or prevented.

Referring to FIG. 5B, the lattice plate 515 may be arranged on a plurality of support bars 514*a* and 514*b*. A portion denoted by A1 of the lattice plate 515 may, for example, refer to a thermocompression area attached to the second support bar 514*b* in a thermocompression method by the adhesive layer 516. A portion denoted by A2 of the lattice plate 515 may refer to a welded area fixed to the plurality of support bars 514*a* and 514*b* in a welding method. A portion denoted by A3 of the lattice plate 515 may refer to an unattached area on which no processing has been performed. In the unattached area, the lattice plate 515 and the first support bar 514*a* may not be fixed to each other.

According to an embodiment, the support bar 514 may include a support bar body 5141 supporting the lattice plate 515 and a support bar arm 5142 protruding from the support bar body 5141 in the Z-axis direction. It should be noted that the first support bar 514*a* or the second support bar 514*b* may be referred to as the support bar 514 herein. The first welded part 517 may be at a position closer to the support bar arm 5142 than a display 561. The first welded part 517 may not overlap the display 561.

Figure 6:
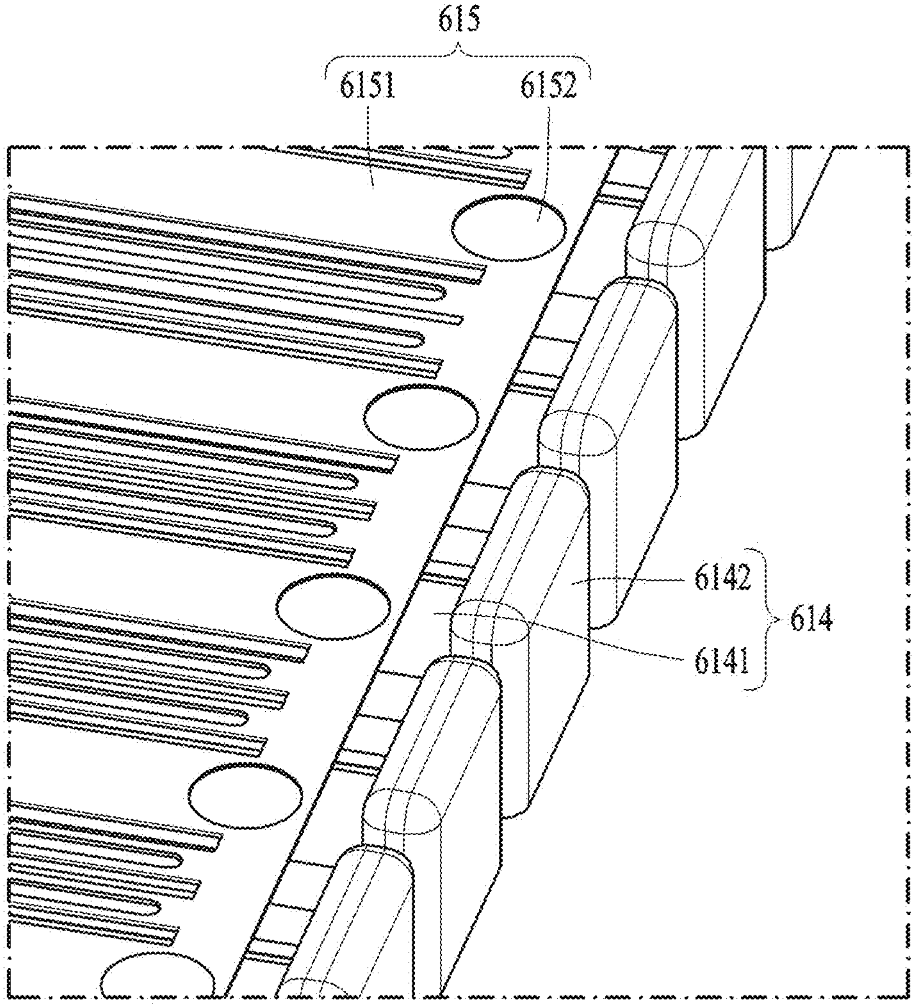
FIG. 6 is a perspective view schematically illustrating the lattice plate and the plurality of support bars, according to an embodiment of the disclosure.

FIG. 6 is a perspective view schematically illustrating the lattice plate and the plurality of support bars, according to an embodiment of the disclosure.

Referring to FIG. 6, a lattice plate 615 may include a lattice plate body 6151 and an etched part 6152 that is recessed in the lattice plate body 6151. The etched part 6152 may be recessed in a surface of the lattice plate body 6151 opposite to a surface thereof facing a support bar 614. The etched part 6152 may, for example, reduce or prevent the thickening of the lattice plate 615 due to a welded part, while the welded part is generated by a laser being irradiated to the lattice plate 615. The support bar 614 may include a support bar body 6141 and a support bar arm 6142.

Figure 7:
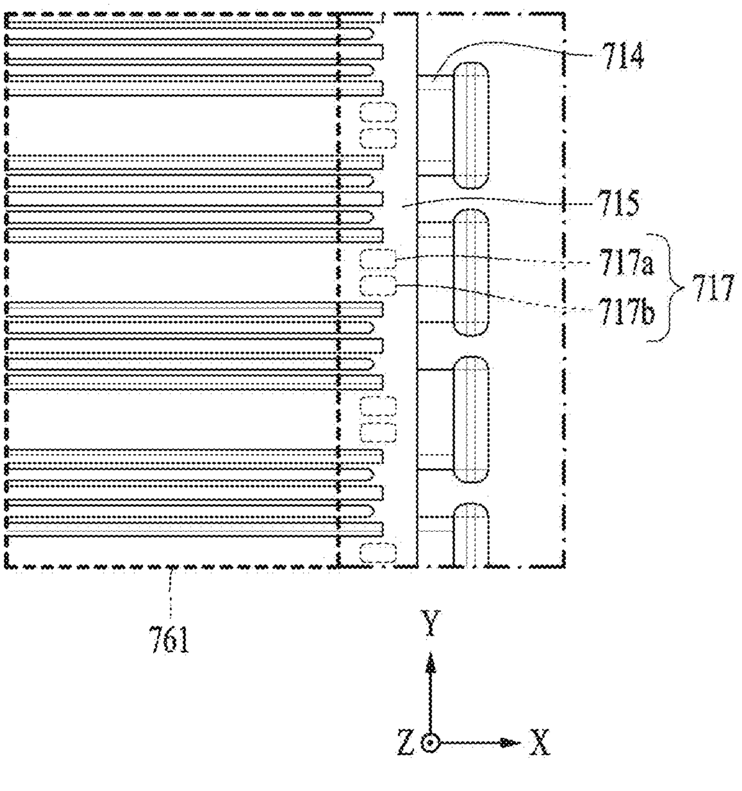
FIG. 7 is another plan view schematically illustrating the adhesive layer and the plurality of support bars, according to an embodiment of the disclosure.

FIG. 7 is another plan view schematically illustrating the adhesive layer and the plurality of support bars, according to an embodiment of the disclosure.

Referring to FIG. 7, a lattice plate 715 may be under a display 761. The lattice plate 715 may be supported by a support bar 714. The lattice plate 715 and the support bar 714 may be connected to each other by a welded part 717. The welded part 717 may include a plurality of welding points 717*a* and 717*b*. The plurality of welding points 717*a* and 717*b* may be spaced apart from each other. The plurality of welding points 717*a* and 717*b* may include a first welding point 717*a* and a second welding point 717*b* that are spaced apart from each other in the Y-axis direction. It is shown that there are two welding points, but the number and arrangement of welding points are not limited thereto. For example, there may be three or more welding points, and a plurality of welding points may be spaced apart in the X-axis and/or Y-axis direction.

Figure 8A:
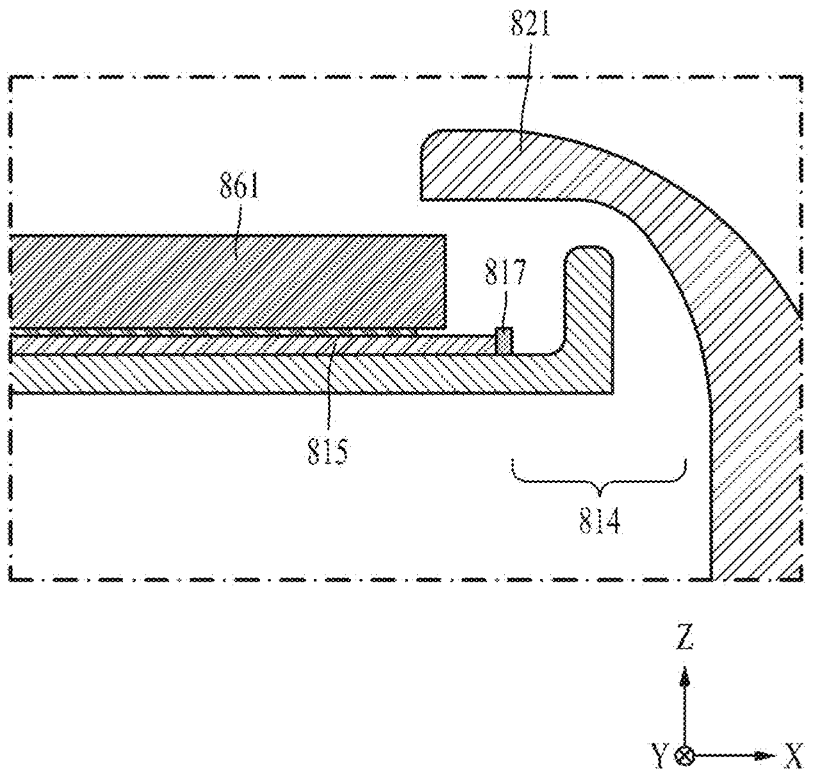
FIG. 8A is another cross-sectional view of the electronic device according to an embodiment of the disclosure.
Figure 8B:
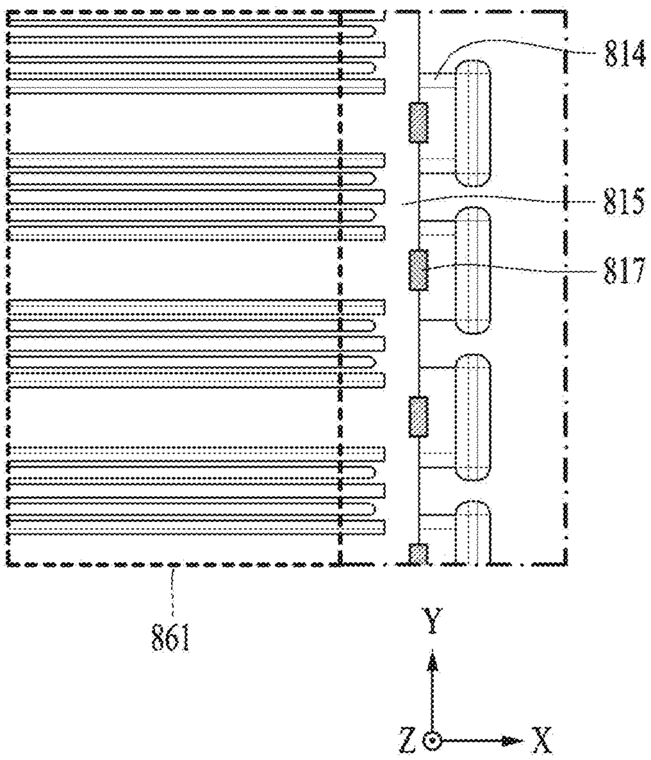
FIG. 8B is another plan view schematically illustrating the adhesive layer and the plurality of support bars, according to an embodiment of the disclosure.

FIG. 8A is another cross-sectional view of the electronic device according to an embodiment of the disclosure. FIG. 8B is another plan view schematically illustrating the adhesive layer and the plurality of support bars, according to an embodiment of the disclosure.

Referring to FIGS. 8A and 8B, a lattice plate 815 may be under a display 861. The lattice plate 815 may be supported by a support bar 814. The lattice plate 815 and the support bar 814 may be connected to each other by a welded part 817. The welded part 817 may be formed at an edge of the lattice plate 815. The welded part 817 may overlap a second cover 821 in the Z-axis direction.

Figure 9:
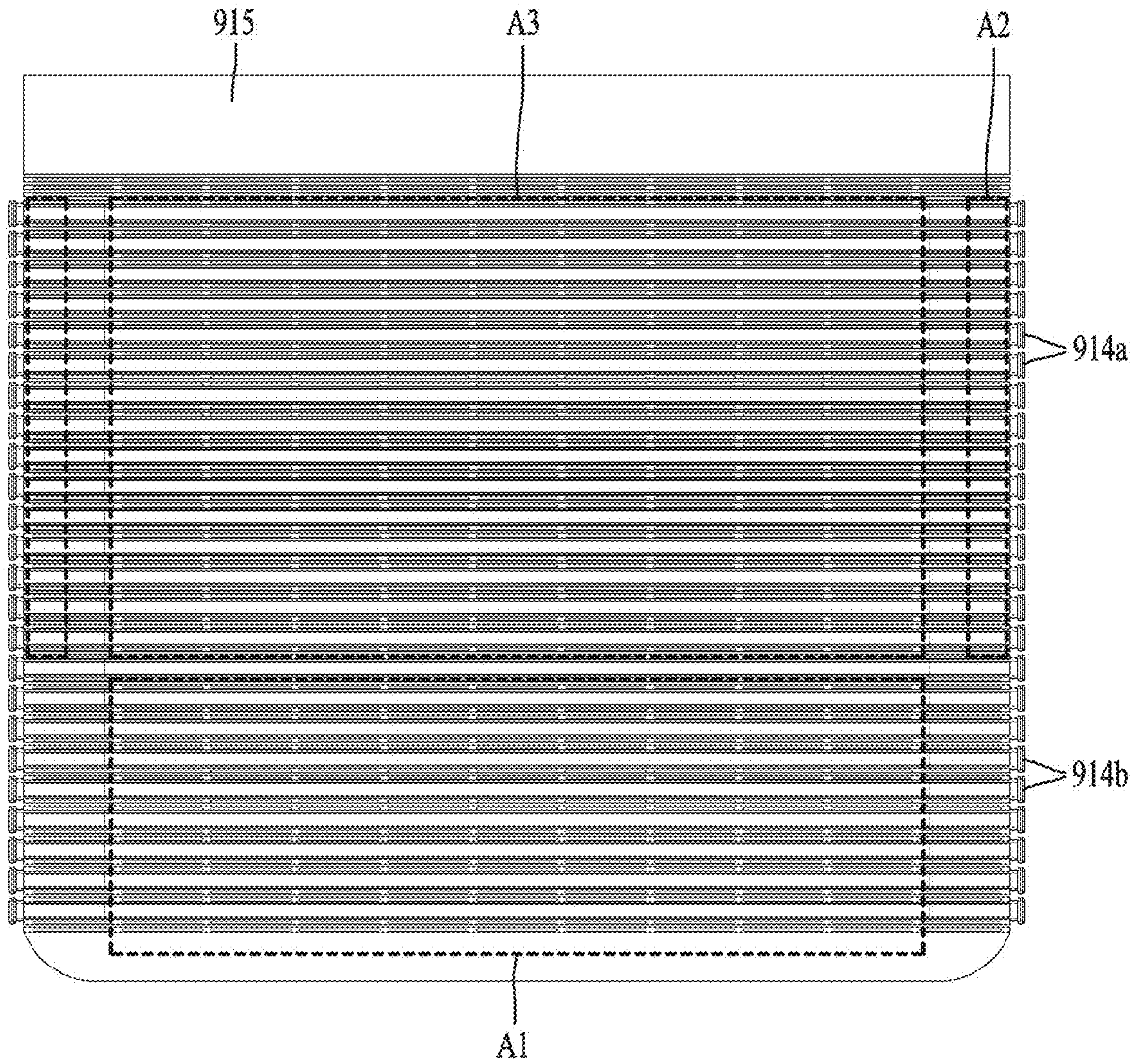
FIG. 9 is another plan view schematically illustrating the plurality of support bars according to an embodiment of the disclosure.

FIG. 9 is another plan view schematically illustrating the plurality of support bars according to an embodiment of the disclosure.

Referring to FIG. 9, a lattice plate 915 may be on a plurality of support bars 914*a* and 914*b*. A portion denoted by A1 of the lattice plate 915 may refer to a thermocompression area attached to a second support bar 914*b* in a thermocompression method by an adhesive layer. A portion denoted by A2 of the lattice plate 915 may refer to a welded area fixed to a first support bars 914*a* in a welding method. A portion denoted by A3 of the lattice plate 915 may refer to an unattached area on which no processing has been performed. In the unattached area, the lattice plate 915 and the first support bar 914*a* may not be fixed to each other.

Figure 10:
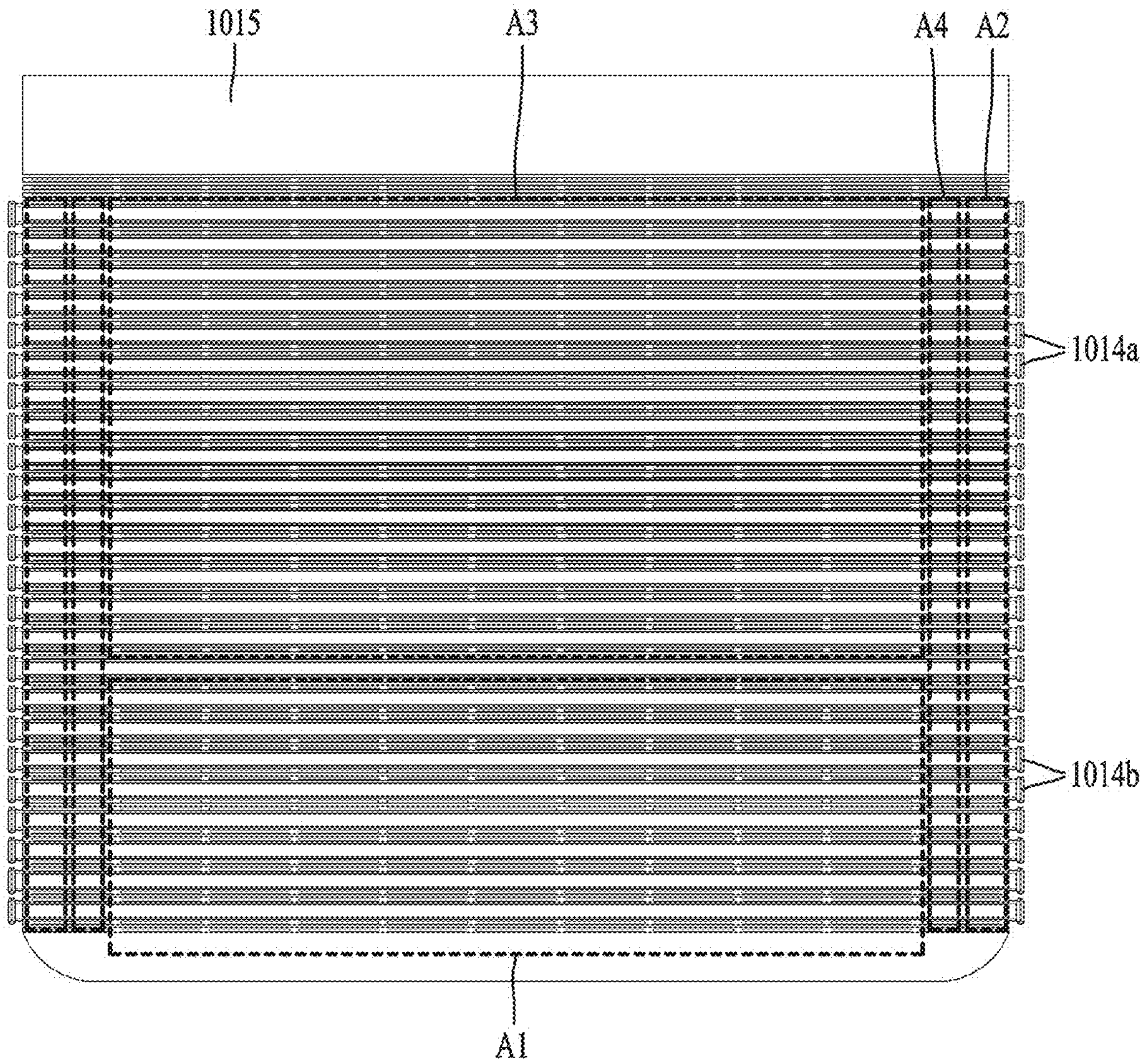
FIG. 10 is yet another plan view schematically illustrating the plurality of support bars according to an embodiment of the disclosure.

FIG. 10 is yet another plan view schematically illustrating the plurality of support bars according to an embodiment of the disclosure.

Referring to FIG. 10, a lattice plate 1015 may be on a plurality of support bars 1014*a* and 1014*b*. A portion denoted by A1 of the lattice plate 1015 may, for example, refer to a thermocompression area attached to a second support bar 1014*b* in a thermocompression method by an adhesive layer. A portion denoted by A2 of the lattice plate 1015 may refer to a welded area fixed to the plurality of support bars 1014*a* and 1014*b* in a welding method. A portion denoted by A3 of the lattice plate 1015 may refer to an unattached area on which no processing has been performed. In the unattached area, the lattice plate 1015 and the first support bar 1014*a* may not be fixed to each other. A portion denoted by A4 of the lattice plate 1015 may refer to an additional attachment area connected to the plurality of support bars 1014*a* and 1014*b* in a thermocompression method. The additional attachment area may, for example, improve the connection stability of the lattice plate 1015 and the plurality of support bars 1014*a* and 1014*b*.

An electronic device includes a first housing 410 including a first cover, a sliding plate fixed to the first cover, and a body frame configured to slidably support the sliding plate, a second housing 420 surrounding at least a portion of the first cover and connected to the body frame and configured to slidably support the first housing, wherein the first housing and the second housing are configured to switch a state between an extended state and a reduced state, a display 461 that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate 415 connected to the display, wherein a plurality of holes formed through the lattice plate, a plurality of first support bars 414*a* connected to the exposed area of the display, a plurality of second support bars 414*b* connected to the non-exposed area of the display, a first welded part 417 configured to connect the plurality of first support bars to the lattice plate, and an adhesive layer 416 configured to connect the plurality of second support bars to the lattice plate.

In an embodiment, the first welded part 417 is provided as a pair of first welded parts, wherein a first welded part of the pair of first welded parts may be at an end of the first support bar, and the other first welded part of the pair of first welded parts may be the other end of the first support bar.

In an embodiment, an adhesive layer may not be between the pair of first welded parts 417.

The first welded part 417 may include a plurality of welding points spaced apart from one another.

In another embodiment, the first welded part 417 may be at an edge of the lattice plate.

In yet another embodiment, the first welded part 417 may overlap the second housing.

In an embodiment, the electronic device may further include a second welded part configured to connect the plurality of second support bars 414*b* to the lattice plate 415.

The second welded part 418 is provided as a pair of second welded parts, wherein a second welded part of the pair of second welded parts may be at an end of the second support bar, and the other second welded part of the pair of second welded parts may be the other end of the second support bar.

In an embodiment, the pair of second welded parts 418 may be opposite to each other based on the adhesive layer.

In an embodiment, the second welded part 418 may overlap the second housing.

The lattice plate 415 may include a lattice plate body and an etched part recessed in the lattice plate body.

In an embodiment, the first support bar 414*a* may include a first support bar body connected to the lattice plate and a second support bar arm protruding from the first support bar body.

In another embodiment, the electronic device may further include a connecting layer configured to connect the display 461 to the lattice plate.

In still another embodiment, at least a portion of the sliding plate 413 may overlap at least a portion of the lattice plate 415.

In an embodiment, at least a portion of the sliding plate 413 may be spaced apart from the display, and the lattice plate 415 may be inserted between the sliding plate and the display.

An electronic device includes a first housing 410 including a first cover, a sliding plate fixed to the first cover, and a body frame configured to slidably support the sliding plate, a second housing 420 surrounding at least a portion of the first cover and connected to the body frame and configured to slidably support the first housing, wherein the first housing and the second housing are configured to switch a state between an extended state and a reduced state, a display 461 that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate 415 connected to the display, wherein a plurality of holes formed through the lattice plate, a plurality of support bars 414*a* and 414*b* connected to the display, and a welded part 417 or 418 configured to connect the plurality of support bars to the lattice plate.

An electronic device includes a first housing 410 including a first cover, a sliding plate fixed to the first cover, and a body frame configured to slidably support the sliding plate, a second housing 420 surrounding at least a portion of the first cover and connected to the body frame and configured to slidably support the first housing, wherein the first housing and the second housing are configured to switch a state between an extended state and a reduced state, a display 461 that is connected to the sliding plate and transformable, wherein the display includes a flat portion that maintains a flat shape and a rolling portion of which a shape is transformed, and the rolling portion includes an exposed area that is visually exposed to the outside and a non-exposed area that is not visually exposed to the outside when the first housing and the second housing are in the extended state, a lattice plate 415 connected to the display, wherein a plurality of holes formed through the lattice plate, a plurality of first support bars 414*a* connected to the exposed area of the display, a plurality of second support bars 414*b* connected to the non-exposed area of the display, a first welded part 417 configured to connect the plurality of first support bars to the lattice plate, a second welded part 418 configured to connect the plurality of second support bars to the lattice plate, and an adhesive layer 416 configured to connect the plurality of second support bars to the lattice plate, wherein the second welded part 418 is provided as a pair of second welded parts, and the pair of second welded parts is opposite to each other based on the adhesive layer.

The effects of the electronic device according to embodiments are not limited to the above-mentioned effects, and other unmentioned effects can be clearly understood from the following description by one of ordinary skill in the art.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

a first housing comprising a first cover, a sliding plate fixed to the first cover, and a body frame configured to slidably support the sliding plate;

a second housing surrounding at least a portion of the first cover and connected to the body frame and configured to slidably support the first housing, wherein the first housing and the second housing are configured to switch a state between an extended state and a reduced state;

a display that is connected to the sliding plate and transformable, wherein the display comprises a flat portion that maintains a flat shape and a rolling portion of which a shape is transformed, and the rolling portion comprises an exposed area that is visually exposed to an outside and a non-exposed area that is not visually exposed to the outside when the first housing and the second housing are in the extended state;

a lattice plate connected to the display, wherein a plurality of holes is formed through the lattice plate;

at least one first support bar connected to the exposed area of the display;

at least one second support bar connected to the non-exposed area of the display;

a pair of first welded parts configured to connect the at least one first support bar to the lattice plate such that the pair of first welded parts does not overlap the display; and an adhesive layer configured to connect the at least one second support bar to the lattice plate, wherein the adhesive layer is not between the pair of first welded parts.

2. The electronic device of claim 1, wherein a first welded part of the pair of first welded parts is at an end of the first support bar, and wherein the other first welded part of the pair of first welded parts is at the other end of the first support bar.

3. The electronic device of claim 2, wherein the pair of first welded parts comprises a plurality of welding points spaced apart from one another.

4. The electronic device of claim 2, wherein the pair of first welded parts are at an edge of the lattice plate.

5. The electronic device of claim 1, wherein the pair of first welded parts overlaps the second housing.

6. The electronic device of claim 1, further comprising:

a second welded part configured to connect the at least one second support bar to the lattice plate.

7. The electronic device of claim 6, wherein the second welded part is provided as a pair of second welded parts, wherein a second welded part of the pair of second welded parts is at an end of the second support bar, and wherein the other second welded part of the pair of second welded parts is at the other end of the second support bar.

8. The electronic device of claim 7, wherein the pair of second welded parts is opposite to each other based on the adhesive layer.

9. The electronic device of claim 6, wherein the second welded part overlaps the second housing.

10. The electronic device of claim 1, wherein the lattice plate comprises a lattice plate body and an etched part recessed in the lattice plate body.

11. The electronic device of claim 1, wherein the first support bar comprises a first support bar body connected to the lattice plate and a second support bar arm protruding from the first support bar body.

12. The electronic device of claim 1, further comprising:

a connecting layer configured to connect the display to the lattice plate.

13. The electronic device of claim 1, wherein at least a portion of the sliding plate overlaps at least a portion of the lattice plate.

14. The electronic device of claim 13, wherein the at least a portion of the sliding plate is spaced apart from the display, and wherein the lattice plate is inserted between the sliding plate and the display.

15. An electronic device comprising:

a first housing comprising a first cover, a sliding plate fixed to the first cover, and a body frame configured to slidably support the sliding plate;

a second housing surrounding at least a portion of the first cover and connected to the body frame and configured to slidably support the first housing, wherein the first housing and the second housing are configured to switch a state between an extended state and a reduced state;

a display that is connected to the sliding plate and transformable, wherein the display comprises a flat portion that maintains a flat shape and a rolling portion of which a shape is transformed, and the rolling portion comprises an exposed area that is visually exposed to an outside and a non-exposed area that is not visually exposed to the outside when the first housing and the second housing are in the extended state;

a lattice plate connected to the display, wherein a plurality of holes is formed through the lattice plate;

a plurality of support bars connected to the display;

a plurality of welded parts configured to connect the plurality of support bars to the lattice plate such that the plurality of welded parts does not overlap the display; and an adhesive layer configured to connect the support bar, of the plurality of support bars, connected to the non-exposed area of the display to the lattice plate, wherein each of the plurality of welded parts are provided as a pair of welded parts, wherein each of the pair of welded parts is disposed at opposite ends of the support bar connected to the non-exposed area of the display based on the adhesive layer.

16. The electronic device of claim 15, wherein a welded part of the pair of welded parts is at an end of the support bar, and wherein the other welded part of the pair of welded parts is at the other end of the support bar.

17. The electronic device of claim 15, wherein the lattice plate comprises a lattice plate body and an etched part recessed in the lattice plate body.

18. An electronic device comprising:

a first housing comprising a first cover, a sliding plate fixed to the first cover, and a body frame configured to slidably support the sliding plate;

a second housing surrounding at least a portion of the first cover and connected to the body frame and configured to slidably support the first housing, wherein the first housing and the second housing are configured to switch a state between an extended state and a reduced state;

a display that is connected to the sliding plate and transformable, wherein the display comprises a flat portion that maintains a flat shape and a rolling portion of which a shape is transformed, and the rolling portion comprises an exposed area that is visually exposed to an outside and a non-exposed area that is not visually exposed to the outside when the first housing and the second housing are in the extended state;

a lattice plate connected to the display, wherein a plurality of holes is formed through the lattice plate;

at least one first support bar connected to the exposed area of the display;

at least one second support bar connected to the non-exposed area of the display;

a pair of first welded parts configured to connect the at least one first support bar to the lattice plate such that the pair of first welded parts does not overlap the display;

a second welded part configured to connect the at least one second support bar to the lattice plate such that the second welded part does not overlap the display; and an adhesive layer configured to connect the at least one second support bar to the lattice plate, wherein the second welded part is provided as a pair of second welded parts, and the pair of second welded parts is opposite to each other based on the adhesive layer, and wherein the adhesive layer is not between the pair of first welded parts.

19. The electronic device of claim 18, wherein the lattice plate is configured to be transformable.

20. The electronic device of claim 18, wherein the sliding plate is configured to move linearly along the body frame.

* * * * *